United States Patent
Lee et al.

(10) Patent No.: US 10,268,066 B2
(45) Date of Patent: Apr. 23, 2019

(54) PHOTOSENSITIVE RESIN COMPOSITION, COLOR CONVERSION PANEL USING THE SAME AND DISPLAY DEVICE

(71) Applicant: Samsung Display Co., Ltd, Yongin-si, Gyeonggi-do (KR)

(72) Inventors: Baek Hee Lee, Yongin-si (KR); Young Min Kim, Yongin-si (KR); Min Ki Nam, Anseong-si (KR); Hae Il Park, Seoul (KR)

(73) Assignee: Samsung Display Co., Ltd. (KR)

( * ) Notice: Subject to any disclaimer, the term of this patent is extended or adjusted under 35 U.S.C. 154(b) by 204 days.

(21) Appl. No.: 14/991,814

(22) Filed: Jan. 8, 2016

(65) Prior Publication Data

US 2016/0202548 A1   Jul. 14, 2016

(30) Foreign Application Priority Data

Jan. 9, 2015 (KR) .................. 10-2015-0003678
Nov. 27, 2015 (KR) .................. 10-2015-0167387

(51) Int. Cl.

| G03F 7/028 | (2006.01) |
| G02B 5/20 | (2006.01) |
| G02F 1/1335 | (2006.01) |
| G03F 7/00 | (2006.01) |
| G02F 1/1333 | (2006.01) |
| G02F 1/1368 | (2006.01) |
| B82Y 20/00 | (2011.01) |
| G03F 7/031 | (2006.01) |
| G03F 7/032 | (2006.01) |
| B82Y 30/00 | (2011.01) |
| G02F 1/1362 | (2006.01) |

(52) U.S. Cl.
CPC ........ *G02F 1/133514* (2013.01); *B82Y 20/00* (2013.01); *G02B 5/201* (2013.01); *G02F 1/1368* (2013.01); *G02F 1/133377* (2013.01); *G02F 1/133512* (2013.01); *G03F 7/0007* (2013.01); *G03F 7/028* (2013.01); *B82Y 30/00* (2013.01); *G02F 2001/136222* (2013.01); *G03F 7/031* (2013.01); *G03F 7/032* (2013.01)

(58) Field of Classification Search
CPC .............. G02B 5/223; G02F 1/133514; G02F 1/133516; G02F 1/133377; G03F 7/0007; G03F 7/028; G03F 7/031; G03F 7/032; B82Y 20/00
USPC ................ 430/7, 270.1, 281.1; 349/106
See application file for complete search history.

(56) References Cited

U.S. PATENT DOCUMENTS

| 2013/0242228 A1* | 9/2013 | Park ................ G02F 1/133617 349/61 |
| 2013/0320264 A1* | 12/2013 | Yoshida .............. H01L 33/501 252/301.36 |
| 2014/0160408 A1* | 6/2014 | Cho .................. G02F 1/133617 349/110 |
| 2015/0185381 A1* | 7/2015 | Wu ........................ G02B 5/201 349/106 |
| 2015/0330602 A1* | 11/2015 | Yonemoto ............ C09K 11/703 349/71 |

FOREIGN PATENT DOCUMENTS

| JP | 2000-038489 A | 2/2000 |
| JP | 2000-502120 A | 2/2000 |
| JP | 2003-255320 A | * 9/2003 |
| KR | 10-2010-0053409 A | 5/2010 |
| KR | 10-2013-0039697 A | 4/2013 |
| KR | 10-2014-0113131 A | 9/2014 |

OTHER PUBLICATIONS

Computer-generated translation of JP 2003-255320 (Sep. 2003). (Year: 2003).*
URL—products—Qlight Nanotech, "Brightness Enhancement Technology", http://qlightnano.com/products, pp. 3, May 11, 2015.

* cited by examiner

*Primary Examiner* — John A McPherson
(74) *Attorney, Agent, or Firm* — Innovation Counsel LLP

(57) ABSTRACT

Provided is a photosensitive resin composition including: a nanophosphor, a photopolymerization initiator, a photopolymerization compound, an antioxidant, and a solvent, in which the antioxidant includes one kind or more selected from phenol-based, phosphorus-based, and sulfur-based compounds.

28 Claims, 16 Drawing Sheets

PHOTOSENSITIVE RESIN COMPOSITION, COLOR CONVERSION PANEL USING THE SAME AND DISPLAY DEVICE

CROSS-REFERENCE TO RELATED APPLICATION

This application claims priority to and the benefit of Korean Patent Application Nos. 10-2015-0003678 and 10-2015-0167387 filed in the Korean Intellectual Property Office on Jan. 9, 2015 and Nov. 27, 2015, respectively, the entire contents of which are incorporated herein by reference.

BACKGROUND (a) Field

The present disclosure relates to a photosensitive resin composition, a color conversion panel using the photosensitive resin composition, and a display device, and more particularly, to a photosensitive resin composition having excellent light efficiency and color reproducibility, a color conversion panel using the same, and a display device.

(b) Description of the Related Art

A color filter of a liquid crystal display or a color conversion layer of a color conversion panel is manufactured by coating a fine layer colored with two or more colors on a transparent substrate.

A colored photosensitive resin composition used to manufacture the color filter or the color conversion layer is generally formed of a binder resin, a photopolymerizable monomer, a photopolymerization initiator, a pigment, a solvent, other additives, and the like.

Meanwhile, since a pigment of colored photosensitive resin composition has a less than optimal luminance characteristic, there is an effort to improve the luminance characteristic using a quantum dot or a phosphor that is a constitution component other than the pigment.

However, recently, according to a high quality specification, a color filter or a color conversion layer having improved luminance, heat resistance, and the like has been desired. Light efficiency or color reproducibility is reduced due to heat generated during a pattern process, and there is a demand for this reduction to be addressed.

The above information disclosed in this Background section is only for enhancement of understanding of the background of the invention and therefore it may contain information that does not form the prior art that is already known in this country to a person of ordinary skill in the art.

SUMMARY

The present invention has been made in an effort to provide a photosensitive resin composition having excellent light efficiency and color reproducibility, a color conversion panel using the same, and a display device.

An exemplary embodiment of the present invention provides a photosensitive resin composition including: a nanophosphor, a photopolymerization initiator, a photopolymerization compound, an antioxidant, and a solvent, in which the antioxidant includes one kind or more selected from phenol-based, phosphorus-based, and sulfur-based compounds.

The nanophosphor may include at least one of a quantum dot and an inorganic phosphor.

The phenol-based antioxidant may include one kind or more selected from 2,6-di-tert-butyl-p-cresol, 2,6-diphenyl-4-octadesiloxyphenol, stearyl(3,5-di-tert-butyl-4-hydroxyphenyl) propionate, distearyl(3,5-di-tert-butyl-4-hydroxybenzyl) phosphonate, tridecyl 3,5-di-tert-butyl-4-hydroxybenzyl thioacetate, thiodiethylenebis[(3,5-di-tert-butyl-4-hydroxyphenyl) propionate], 4,4'-thiobis(6-tert-butyl-m-cresol), 2-octylthio-4,6-di(3,5-di-tert-butyl-4-hydroxyphenoxy)-s-triazine, 2,2'-methylenebis(4-methyl-6-tert-butylphenol), bis[3,3-bis(4-hydroxy-3-tert-butylphenyl) butyric acid]glycolester, 4,4'-butylidenebis(2,6-di-tert-butylphenol), 4,4'-butylidenebis(6-tert-butyl-3-methylphenol), 2,2'-ethylidenebis(4,6-di-tert-butylphenol), 1,1,3-tris(2-methyl-4-hydroxy-5-tert-butylphenyl)butane, bis[2-tert-butyl-4-methyl-6-(2-hydroxy-3-tert-butyl-5-methylbenzyl)phenyl]terephthalate, 1,3,5-tris(2,6-dimethyl-3-hydroxy-4-tert-butylbenzyl) isocyanurate, 1,3,5-tris(3,5-di-tert-butyl-4-hydroxybenzyl) isocyanurate, 1,3,5-tris(3,5-di-tert-butyl-4-hydroxybenzyl)-2,4,6-trimethylbenzene, 1,3,5-tris[(3,5-di-tert-butyl-4-hydroxyphenyl) propionyloxyethyl]isocyanurate, tetrakis[methylene-3-(3', 5'-di-tert-butyl-4'-hydroxyphenyl) propionate]methane, 2-tert-butyl-4-methyl-6-(2-acryloyloxy-3-tert-butyl-5-methylbenzyl)phenol, 3,9-bis[2-(3-tert-butyl-4-hydroxy-5-methylhydrocinnamoyloxy)-1,1-dimethylethyl]-2,4,8,10-tetraoxaspiro[5.5]undecane, triethyleneglycolbis[β-(3-tert-butyl-4-hydroxy-5-methylphenyl) propionate], and tocophenol.

The phosphorus-based antioxidant may include at least one of triphenyl phosphite, tris(2,4-di-tert-butylphenyl) phosphite, tris(2,5-di-tert-butylphenyl) phosphite, tris(nonylphenyl) phosphite, tris(dinonylphenyl) phosphite, tris(mono,di-mixed nonylphenyl) phosphite, diphenylacid phosphite, 2,2'-methylenebis(4,6-di-tert-butylphenyl)octyl phosphite, diphenyldecyl phosphite, diphenyloctyl phosphite, di(nonylphenyl)pentaerythritol diphosphite, phenyldiisodecyl phosphite, tributyl phosphite, tris(2-ethylhexyl) phosphite, tridecyl phosphite, trilauryl phosphite, dibutyl acid phosphite, dilauryl acid phosphite, trilauryl trithiophosphite, bis(neopentylglycol) 1,4-cyclohexanedimethyl diphosphite, bis(2,4-di-tert-butylphenyl)pentaerythritol diphosphite, bis(2,5-di-tert-butylphenyl)pentaerythritol diphosphite, bis(2,6-di-tert-butyl-4-methylphenyl)pentaerythritol diphosphite, bis(2,4-dicumylphenyl)pentaerythritol diphosphite, distearylpentaerythritol diphosphite, tetra (C12-15 mixed-alkyl)-4,4'-isopropylidenediphenyl phosphite, bis[2,2'-methylenebis(4,6-diamylphenyl)]isopropylidenediphenyl phosphite, tetratridecyl 4,4'-butylidenebis(2-tert-butyl-5-methylphenol) diphosphite, hexa(tridecyl) 1,1,3-tris(2-methyl-5-tert-butyl-4-hydroxyphenyl)butane triphosphite, tetrakis(2,4-di-tert-butylphenyl)biphenylene diphosphonite, tris(2-[(2,4,7,9-tetrakis-tert-butyldibenzo[d, f][1,3,2]dioxaphosphepin-6-yl)oxy]ethyl)amine, 9,10-dihydro-9-oxa-10-phosphaphenanthrene-10-oxide, tris(2-[(2, 4,8,10-tetrakis-tert-butyldibenzo[d,f][1,3,2] dioxaphosphepin-6-yl)oxy]ethyl)amine, and 2-(1,1-dimethylethyl)-6-methyl-4-[3-[[2,4,8,10-tetrakis(1,1-dimethylethyl)dibenzo[d,f][1,3,2]dioxaphosphepin-6-yl] oxy]propyl]phenol2-butyl-2-ethylpropanediol 2,4,6-tri-tert-butylphenol monophosphite.

The sulfur-based antioxidant may include at least one of dialkyl thiodipropionate β-alkylmercaptopropionic acid ester of polyol.

The antioxidant may be included in a content of 1 to 5 wt % based on a total weight of a solid of the photosensitive resin composition.

The quantum dot may include one kind or more selected from a Group II-VI compound, a Group III-V compound, a Group III-VI compound, a Group IV-VI compound, a Group II-III-V element, a Group II-III-VI compound, a Group IV element, and a Group IV compound, and the quantum dot may have a core-shell structure including a core and a shell covering the core.

The core may include at least one of CdSe, CdS, ZnS, ZnSe, CdTe, CdSeTe, CdZnS, PbSe, AgInZnS, ZnTe, CdSeS, PbS, PbTe, HgS, HgSe, HgTe, GaN, GaP, GaAs, InP, InZnP, InGaP, InGaN, InAs, and ZnO.

The shell may include at least one of CdSe, ZnSe, ZnS, ZnTe, CdTe, PbS, TiO, SrSe, CdO, CdS, ZnO, InP, InS, GaP, GaN, GaO, InZnP, InGaP, InGaN, InZnSCdSe, and HgSe.

The inorganic phosphor may include one kind or more selected from garnets, silicates, sulfides, oxides (oxynitrides), nitrides, and aluminates.

The inorganic phosphor may include at least one of Y3Al5O12:Ce3+(YAG:Ce), Tb3Al5O12:Ce3+(TAG:Ce), (Sr,Ba,Ca)2SiO4:Eu2+, (Sr,Ba,Ca,Mg,Zn)2Si (OD)4:Eu2+ D=F,Cl,S,N,Br, Ba2MgSi2O7:Eu2+, Ba2SiO4:Eu2+, Ca3(Sc,Mg)2Si3O12:Ce3+, (Ca,Sr)S:Eu2+, (Sr,Ca)Ga2S4:Eu2+, SrSi2O2N2:Eu2+, SiAlON:Ce3+, β-SiAlON:Eu2+, Ca-α-SiAlON:Eu2+, Ba3Si6O12N2:Eu2+, CaAlSiN3:Eu2+, (Sr,Ca)AlSiN3:Eu2+, Sr2Si5N8:Eu2+, (Sr,Ba)Al2O4:Eu2+, (Mg,Sr)Al2O4:Eu2+, and BaMg2Al16O27:Eu2+.

The photosensitive resin composition may further include a dispersant.

The photosensitive resin composition may further include a light scatterer.

The light scatterer may include at least one of TiO2, $Al_2O_3$, and $SiO_2$.

Another exemplary embodiment of the present disclosure provides a liquid crystal display including a photosensitive resin composition, including: a lower substrate, a thin film transistor provided on the lower substrate; a pixel electrode connected with the thin film transistor; an upper substrate facing the lower substrate; and a color filter provided between the lower substrate and the upper substrate, wherein the color filter includes a nanophosphor and an antioxidant, and the antioxidant includes one selected from phenol-based, phosphorus-based, and sulfur-based compounds.

Another exemplary embodiment of the present inventive concept provides a color conversion panel including a photosensitive resin composition, including: a first substrate; a plurality of color conversion layers and a transmission layer provided on the first substrate; and a light blocking member provided between neighboring color conversion layers and between one of the plurality of color conversion layers and the transmission layer, wherein the color conversion layer comprises a nanophosphor and an antioxidant, and the antioxidant includes one selected from phenol-based, phosphorus-based, and sulfur-based compounds.

Another exemplary embodiment of the present invention provides a display device including a photosensitive resin composition, including: a display panel; and a color conversion panel provided on the display panel, wherein the color conversion panel includes: a first substrate; a plurality of color conversion layers and a transmission layer provided in one side of the first substrate, facing the display panel; and a light blocking member provided between every neighboring color conversion layers among the plurality of color conversion layers and between one of the plurality of color conversion layers and the transmission layer, wherein the color conversion layer includes a nanophosphor and an antioxidant, and the antioxidant includes one selected from phenol-based, phosphorus-based, and sulfur-based compounds.

The display panel may include a lower substrate, a thin film transistor provided on the lower substrate, and a pixel electrode connected with the thin film transistor.

The display device may further include an upper substrate facing the lower substrate at a distance therefrom and a liquid crystal layer provided between the lower substrate and the upper substrate.

The display device may further include a roof layer facing the pixel electrode and a liquid crystal layer provided in a plurality of microcavities between the pixel electrode and the roof layer.

The display device may further include an organic light emitting member provided on the pixel electrode and a common electrode provided on the organic light emitting member.

According to the exemplary embodiment of the present invention, by adding the antioxidant to the photosensitive resin composition including the nanophosphor, it is possible to prevent a quenching phenomenon caused by damage of the nanophosphor occurring during the progression of a process, and thus light efficiency and color reproducibility of a display device are excellent.

DETAILED DESCRIPTION OF THE EMBODIMENTS

Figure 1A:
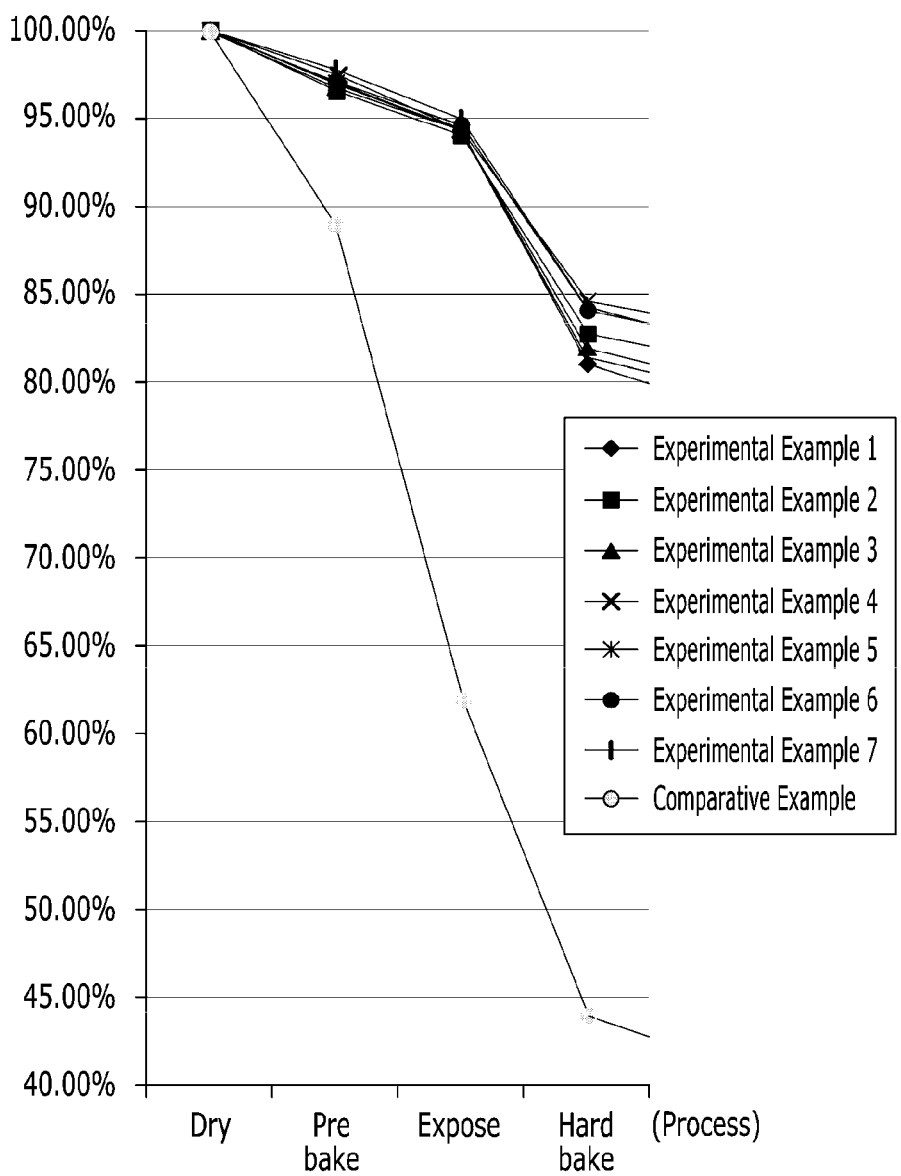
FIGS. 1A and 1B are graphs obtained by measuring a light maintenance ratio and a light quantity of green light according to the progression of a pattern process using a photosensitive resin compositions according to exemplary embodiments (RS-1, RS-2, . . . RS-7) and a Comparative Example ("Ref") of the present inventive concept.

The present disclosure will be described more fully hereinafter with reference to the accompanying drawings, in which exemplary embodiments of the invention are shown. As those skilled in the art would realize, the described embodiments may be modified in various different ways, all without departing from the spirit or scope of the present disclosure.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, it will be understood that when an element is provided "on" something, the word "on" may relates to a gravitational direction or opposite to the gravitational direction.

A photosensitive resin composition according to an exemplary embodiment includes a nanophosphor, a photopolymerization initiator, a photopolymerization compound, an antioxidant, and a solvent.

First, the nanophosphor according to the exemplary embodiment may include at least one of a quantum dot or an inorganic phosphor.

The quantum dot included in the nanophosphor according to the exemplary embodiment may include a Group II-VI compound, a Group III-V compound, a Group IV-VI compound, a Group IV element, a Group IV compound, and a combination thereof.

The Group II-VI compound may be selected from the group consisting of a binary compound selected from the group consisting of CdO, CdS, CdSe, CdTe, ZnS, ZnSe, ZnTe, ZnO, HgS, HgSe, HgTe, MgSe, MgS, SrSe and a mixture thereof; a tertiary compound selected from the group consisting of CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof.

The Group III-V compound may be selected from the group consisting of a binary compound selected from the group consisting of GaN, GaP, GaAs, GaSb, AN, AlP, AlAs, AlSb, InN, InP, InAs, InSb, and a mixture thereof; a tertiary compound selected from the group consisting of GaNP, GaNAs, GaNSb, GaPAs, GaPSb, AlNP, ANAs, AlNSb, AlPAs, AlPSb, InNP, InNAs, InNSb, InPAs, InPSb, InGaP, and InGaN and a mixture thereof; and a quaternary compound selected from the group consisting of GaAlNAs, GaAlNSb, GaAlPAs, GaAlNP, GaInNP, GaInNAs, GaInNSb, GaInPAs, GaInPSb, InAlNP, InAlNAs, InAlNSb, InAlPAs, InAlPSb, and a mixture thereof.

The Group IV-VI compound may be selected from the group consisting of a binary compound selected from the group consisting of SnS, SnSe, SnTe, PbS, PbSe, PbTe, and a mixture thereof; a tertiary compound selected from the group consisting of SnSeS, SnSeTe, SnSTe, PbSeS, PbSeTe, PbSTe, SnPbS, SnPbSe, SnPbTe, and a mixture thereof; and a quaternary compound selected from the group consisting of SnPbSSe, SnPbSeTe, SnPbSTe, and a mixture thereof. The Group IV element may be selected from the group consisting of Si, Ge, and a mixture thereof. The Group IV compound may be a binary compound selected from the group consisting of SiC, SiGe, and a mixture thereof.

In addition, the Group III-VI compound, the Group II-III-V compound, or the Group II-III-VI compound, and a combination thereof may be included.

The Group III-VI compound may include a compound of GaO and the like, the group II-III-V compound may include a compound of InZnP and the like, and the group II-III-VI compound may include a compound of InZnSCdSE and the like, but this is not restrictive.

In this case, the binary compound, the tertiary compound, or the quaternary compound may exist in particles at a uniform concentration, or may exist in the same particle divided into states where concentration distributions are partially different. Further, the nanophosphor may have a core/shell structure where one quantum dot surrounds another quantum dot. An interface between the core and the shell may have a concentration gradient, such that a concentration of an element existing in the shell is gradually reduced nearing to the center thereof.

For example, the quantum dot may have a core/shell structure including a core and a shell covering the core.

The core may include one or more materials selected from the group consisting of CdSe, CdS, ZnS, ZnSe, CdTe, CdSeTe, CdZnS, PbSe, AgInZnS, ZnTe, CdSeS, PbS, PbTe, HgS, HgSe, HgTe, GaN, GaP, GaAs, InP, InZnP, InGaP, InGaN, InAs, and ZnO, but is not limited thereto. The shell may include one or more materials selected from the group consisting of CdSe, ZnSe, ZnS, ZnTe, CdTe, PbS, SrSe, CdO, CdS, ZnO, InP, InS, GaP, GaN, GaO, InZnP, InGaP, InGaN, InZnSCdSe, and HgSe, but is not limited thereto.

An average particle diameter of the core of the core/shell quantum dot may be 2 nm to 5 nm. Meanwhile, an average thickness of the shell may be 3 nm to 5 nm. Further, the average particle diameter of the quantum dot may be 5 nm to 10 nm. In the case where the core, the shell, and the quantum dot satisfy the aforementioned range of the average particle diameter or average thickness, of course, a characteristic behavior as the quantum dot may be performed, and in a composition for forming a pattern, excellent dispersibility may be secured. In the aforementioned range, by variously selecting the particle diameter of the core, the average thickness of the shell, and the average particle diameter of the quantum dot, light emitting colors of the quantum dot and/or semiconductor characteristics of the quantum dot, and the like may be variously changed.

Further, a form of the quantum dot is a form generally used in the art and is not particularly limited, but more specifically, it is preferable to use forms such as spherical, pyramidal, multi-arm-shaped, or cubic nanoparticles, nanotubes, nanowires, nanofibers, and nanoplate-shaped particles.

The photosensitive resin composition according to the present exemplary embodiment includes a lambertial quantum dot, and when being applied to a display device, a viewing angle of the display device can be improved.

The inorganic phosphor included in the nanophosphor according to the exemplary embodiment may include one or more of garnets, silicates, sulfides, oxynitrides, nitrides, and aluminates.

The inorganic phosphor may include one or more materials selected from the group consisting of $Y_3Al_5O_{12}:Ce^{3+}$ (YAG:Ce), $Tb_3Al_5O_{12}:Ce^{3+}$(TAG:Ce), $(Sr,Ba,Ca)_2SiO_4$: $Eu^{2+}$, $(Sr,Ba,Ca,Mg,Zn)_2Si(OD)_4:Eu^{2+}$ D=F,Cl,S,N,Br, $Ba_2MgSi_2O_7:Eu^{2+}$, $Ba_2SiO_4:Eu^{2+}$, $Ca_3(Sc,Mg)_2Si_3O_{12}$: $Ce^{3+}$, $(Ca,Sr)S:Eu^{2+}$, $(Sr,Ca)Ga_2S_4:Eu^{2+}$, $SrSi_2O_2N_2$: $Eu^{2+}$, SiAlON:$Ce^{3+}$, β-SiAlON:$Eu^{2+}$, Ca-α-SiAlON: $Eu^{2+}$, $Ba_3Si_6O_{12}N_2:Eu^{2+}$, $CaAlSiN_3:Eu^{2+}$, (Sr,Ca) $AlSiN_3:Eu^{2+}$, $Sr_2Si_5N_8:Eu^{2+}$, $(Sr,Ba)Al_2O_4:Eu^{2+}$, (Mg, Sr)$Al_2O_4:Eu^{2+}$, and $BaMg_2Al_{16}O_{27}:Eu^{2+}$.

The nanophosphor including the quantum dot or the inorganic phosphor as described above may be directly added as it is to the photosensitive resin composition, or may be added in a form of a nanophosphor dispersion solution including a dispersant and the like.

Here, the dispersant is a material added to disperse the nanophosphor in a solution to make a stable suspension.

In this case, as the dispersant that may be included in the nanophosphor dispersion solution, a non-ionic dispersant, an ionic dispersant, or a cationic dispersant may be selectively used, and for example, polyalkylene glycol and ester thereof; polyoxyalkylene; an polyalcohol ester alkylene oxide addition; an alcohol alkylene oxide addition, and the like may be used alone or used while being appropriately combined.

Further, as the solvent that may be included in the nanophosphor dispersion solution, ethyleneglycol acetate, ethylcellosolve, propyleneglycolmethylether acetate, ethyl lactate, polyethyleneglycol, cyclohexanone, propyleneglycolmethylether, and the like may be used.

First, the photopolymerization initiator included in the photosensitive resin composition according to the exemplary embodiment is a material serving to initiate crosslinking and curing reactions between photosensitive functional groups and photosensitive materials in the photosensitive resin composition, and one kind or more selected from acetophenone-based, benzoin-based, benzophenone-based, triazine-based, oxime-based, and thioxanthone-based photopolymerization initiators may be used.

Examples of the acetophenone-based photopolymerization initiator may include 4-phenoxy dichloroacetophenone, 4-t-butyl dichloroacetophenone, 4-t-butyl trichloroacetophenone, 2,2-diethoxyacetophenone, 2-hydroxy-2-methyl-1-phenylpropane-1-one, 1-(4-isopropylphenyl)-2-hydroxy-2-methyl-propane-1-one, 1-(4-dodecylphenyl)-2-hydroxy-2-methylpropane-1-one, 4-(2-hydroxyethoxy)-phenyl-(2-hydroxy-2-propyl)ketone, 1-hydroxycyclohexylphenylketone, 2-methyl-1-[4-(methylthio)phenyl]-2-morpholino-propane-1-one, and the like, but are not limited thereto.

As the benzoin-based photopolymerization initiator, benzoin, benzoin methyl ether, benzoin ethyl ether, benzoin isopropyl ether, benzoin isobutyl ether, benzyl dimethyl ketal, and the like may be used, but the benzoin-based photopolymerization initiator is not limited thereto.

Examples of the benzophenone-based photopolymerization initiator may include benzophenone, benzoyl benzoic acid, benzoyl benzoic acid methyl ester, 4-phenylbenzophenone, hydroxybenzophenone, 4-benzoyl-4'-methyldiphenyl sulphide, 3,3'-dimethyl-4-methoxybenzophenone, and the like, but are not limited thereto.

Examples of the triazine-based photopolymerization initiator may include 2,4,6-trichloro-s-triazine, 2-phenyl 4,6-bis(trichloromethyl)-s-triazine, 2-(3',4'-dimethoxystyryl)-4, 6-bis(trichloromethyl)-s-triazine, 2-(4'-methoxynaphthyl)-4, 6-bis(trichloromethyl)-s-triazine, 2-(p-methoxyphenyl)-4,6-bis(trichloromethyl)-s-triazine, 2-(p-tolyl)-4,6-bis (trichloromethyl)-s-triazine, 2-biphenyl 4,6-bis (trichloromethyl)-s-triazine, bis(trichloromethyl)-6-styryl-s-triazine, 2-(naphtho-1-yl)-4,6-bis(trichloromethyl)-s-triazine, 2-(4-methoxynaphtho-1-yl)-4,6-bis (trichloromethyl)-s-triazine, 2-4-bis(trichloromethyl)-6-piperonyl-s-triazine, 2-4-bis(trichloromethyl)-6-(4-methoxystyryl)-s-triazine, and the like.

As the oxime-based photopolymerization initiator, an O-acyloxime-based compound, 2-(0-benzoyloxime)-1-[4-(phenylthio)phenyl]-1,2-octanedione, 1-(0-acetyloxime)-1-[9-ethyl-6-(2-methylbenzoyl)-9H-carbazole-3-yl]ethanone, O-ethoxycarbonyl-α oxyamino-1-phenylpropane-1-one, and the like may be used. Specific examples of the O-acyloxime-based compound may include 1,2-octanedione, 2-dimethylamino-2-(4-methylbenzyl)-1-(4-morpholine-4-yl-phenyl)-butane-1-one, 1-(4-phenylsulfanylphenyl)-butane-1,2-dione 2-oxime-O-benzoate, 1-(4-phenylsulfanylphenyl)-octane-1,2-dione 2-oxime-O-benzoate, 1-(4-phenylsulfanylphenyl)-octane-1-one oxime-O-acetate, 1-(4-phenylsulfanylphenyl)-butane-1-one oxime-O-acetate, and the like.

Examples of the thioxanthone-based photopolymerization initiator may include thioxanthone, 2-chlorothioxanthone, 2-methylthioxanthone, isopropylthioxanthone, 2,4-diethylthioxanthone, 2,4-diisopropylthioxanthone, and the like.

A content of the photopolymerization initiator is not particularly limited, and may be selected in an appropriate range in consideration of initiation performance of the photopolymerization initiator, a size of a photosensitive resin pattern to be formed, and the like.

The solvent included in the photosensitive resin composition according to the exemplary embodiment is a general organic solvent for forming a quantum dot-containing pattern, and for example, may be one or more of DMF, 4-hydroxy-4-methyl-2-pentanone, ethylene glycol monoethyl ether, 2-methoxyethanol, chloroform, chlorobenzene, toluene, tetrahydrofuran, dichloromethane, hexane, heptane, octane, nonane, and decane, but is not limited thereto.

Next, the photopolymerization compound included in the photosensitive resin composition according to the exemplary embodiment may participate in cross-linking and curing reactions together with a photosensitive compound or a photosensitive functional group bonded to a surface of the nanophosphor during exposure. Accordingly, the photopolymerization compound can increase resolution of the photosensitive resin pattern and durability of a cured material.

As the photopolymerization compound, monofunctional or multi-functional esters of (metha)acrylic acid having at least one ethylenically unsaturated double bond may be used alone, or two kinds or more thereof may be used together.

The photopolymerization compound may have the ethylenically unsaturated double bond to cause sufficient polymerization during exposure in a process of forming the pattern and thus form the pattern having excellent heat resistance, light resistance, and chemical resistance.

Specific examples of the photopolymerization compound may include ethylene glycol di(metha)acrylate, diethylene glycol di(metha)acrylate, triethylene glycol di(metha)acrylate, propylene glycol di(metha)acrylate, neopentyl glycol di(metha)acrylate, 1,4-butanediol di(metha)acrylate, 1,6-hexanediol di(metha)acrylate, bisphenol A di(metha)acrylate, pentaerythritol di(metha)acrylate, pentaerythritol tri(metha)acrylate, pentaerythritol tetra(metha)acrylate, pentaerythritol hexa(metha) acrylate, dipentaerythritol di(metha) acrylate, dipentaerythritol tri(metha)acrylate, dipentaerythritol penta(metha)acrylate, dipentaerythritol hexa(metha)acrylate, bisphenol A epoxy(metha)acrylate, ethylene glycol monomethylether (metha)acrylate, trimethylol propane tri(metha)acrylate, tris(metha)acryloyloxyethyl phosphate, novolac epoxy (metha)acrylate, and the like.

The photopolymerization compound may be treated by acid anhydride to be used so that a more excellent developing property is provided.

Further, the photopolymerization compound may be a multi-functional acrylate-based compound or a multi-functional polyalkylene oxide or polysiloxane-based polymer including one or more of an acryl group and a vinyl group.

The photopolymerization compound may include urethane acrylate, allyloxylated cyclohexyl diacrylate, bis(acryloxyethyl)hydroxyl isocyanurate, bis(acryloxyneopentylglycol) adipate, bisphenol A diacrylate, bisphenol A dimethacrylate, 1,4-butanediol diacrylate, 1,4-butanediol dimethacrylate, 1,3-butyleneglycol diacrylate, 1,3-butyleneglycol dimethacrylate, dicyclopentanyl diacrylate, diethyleneglycol diacrylate, diethyleneglycol dimethacrylate, dipentaerythritol hexaacrylate, dipentaerythritol monohydroxy pentacrylate, ditrimethylolpropane tetraacrylate, ethyleneglycol dimethacrylate, glycerol methacrylate, 1,6-hexanediol diacrylate, neopentylglycol dimethacrylate, neopentylglycol hydroxypivalate diacrylate, pentaerythritol triacrylate, pentaerythritol tetraacrylate, phosphoric acid dimethacrylate, polyetyleneglycol diacrylate, polypropyleneglycol diacrylate, tetraethyleneglycol diacrylate, tetrabromobisphenol A diacrylate, triethyleneglycol divinylether, triglycerol diacrylate, trimethylolpropane triacrylate, tripropyleneglycol diacrylate, tris(acryloxyethyl) isocyanurate, phosphoric acid triacrylate, phosphoric acid diacrylate, acrylic acid propargyl ester, polydimethylsiloxane having a vinyl group at a terminal thereof (vinyl-terminated polydimethylsiloxane), a diphenylsiloxane-dimethylsiloxane copolymer having a vinyl group at a terminal thereof (vinyl-terminated diphenylsiloxane-dimethylsiloxane copolymer), polyphenylmethylsiloxane having a vinyl group at a terminal thereof (vinyl-terminated polyphenylmethylsiloxane), a trifluoromethylsiloxane-dimethylsiloxane copolymer having a vinyl group at a terminal thereof (vinyl-terminated trifluoromethylsiloxane-dimethylsiloxane copolymer), a diethylsiloxane-dimethylsiloxane copolymer having a vinyl group at a terminal thereof (vinyl-terminated diethylsiloxane-dimethylsiloxane copolymer), vinylmethylsiloxane, polydimethyl siloxane having a monomethacryloxypropyl group at a terminal thereof (monomethacryloyloxypropyl-terminated polydimethyl siloxane), polydimethyl siloxane having a monovinyl group at a terminal thereof (monovinyl-terminated polydimethyl siloxane), or polyethylene oxide having a monoallyl group or a monotrimethylsiloxy group at a terminal thereof (monoallyl or monotrimethylsiloxy-terminated polyethylene oxide).

The content of the photopolymerization compound is not particularly limited, and may be appropriately selected in consideration of photocuring properties (a curing speed, a cured film state, and the like), the bond number of photosensitive functional groups of the surface of the nanophosphor, and the like.

The photopolymerization compound may further include one or more materials selected from a cyanine-based material, a merocyanine-based material, an oxonol-based material, a phthalocyanine-based material, an azo-based material, a fluorene-based material, a thiophene-based material, a diphenylethene-based material, and a phenoxazine-based material in order to form a precise pattern, but is not limited thereto.

The photosensitive resin composition according to the exemplary embodiment of the present invention further includes an antioxidant.

As the antioxidant, one or two or more sepected from phenol-based, phosphorus-based, and sulfur-based compounds may be used.

The phenol-based antioxidant may include, for example, at least one of 2,6-di-tert-butyl-p-cresol, 2,6-diphenyl-4-octadesiloxyphenol, stearyl(3,5-di-tert-butyl-4-hydroxyphenyl) propionate, distearyl(3,5-di-tert-butyl-4-hydroxybenzyl) phosphonate, tridecyl 3,5-di-tert-butyl-4-hydroxybenzyl thioacetate, thiodiethylenebis[(3,5-di-tert-butyl-4-hydroxyphenyl) propionate], 4,4'-thiobis(6-tert-butyl-m-cresol), 2-octylthio-4,6-di(3,5-di-tert-butyl-4-hydroxyphenoxy)-s-triazine, 2,2'-methylenebis(4-methyl-6-tert-butylphenol), bis[3,3-bis(4-hydroxy-3-tert-butylphenyl) butyric acid]glycolester, 4,4'-butylidenebis(2,6-di-tert-butylphenol), 4,4'-butylidenebis(6-tert-butyl-3-methylphenol), 2,2'-ethylidenebis(4,6-di-tert-butylphenol), 1,1,3-tris(2-methyl-4-hydroxy-5-tert-butylphenyl)butane, bis[2-tert-butyl-4-methyl-6-(2-hydroxy-3-tert-butyl-5-methylbenzyl)phenyl]terephthalate, 1,3,5-tris(2,6-dimethyl-3-hydroxy-4-tert-butylbenzyl) isocyanurate, 1,3,5-tris(3,5-di-tert-butyl-4-hydroxybenzyl) isocyanurate, 1,3,5-tris(3,5-di-tert-butyl-4-hydroxybenzyl)-2,4,6-trimethylbenzene, 1,3,5-tris[(3,5-di-tert-butyl-4-hydroxyphenyl) propionyloxyethyl]isocyanurate, tetrakis[methylene-3-(3', 5'-di-tert-butyl-4'-hydroxyphenyl) propionate]methane, 2-tert-butyl-4-methyl-6-(2-acryloyloxy-3-tert-butyl-5-methylbenzyl)phenol, 3,9-bis[2-(3-tert-butyl-4-hydroxy-5-methylhydrocinnamoyloxy)-1,1-dimethylethyl]-2,4,8,10-tetraoxaspiro[5.5]undecane, triethyleneglycolbis[β-(3-tert-butyl-4-hydroxy-5-methylphenyl) propionate], and tocophenol.

The phosphorus-based antioxidant may include, for example, at least one of triphenyl phosphite, tris(2,4-di-tert-butylphenyl) phosphite, tris(2,5-di-tert-butylphenyl) phosphite, tris(nonylphenyl) phosphite, tris(dinonylphenyl) phosphite, tris(mono,di-mixed nonylphenyl) phosphite, diphenylacid phosphite, 2,2'-methylenebis(4,6-di-tert-butylphenyl)octyl phosphite, diphenyldecyl phosphite, diphenyloctyl phosphite, di(nonylphenyl)pentaerythritol diphosphite, phenyldiisodecyl phosphite, tributyl phosphite, tris(2-ethylhexyl) phosphite, tridecyl phosphite, trilauryl phosphite, dibutyl acid phosphite, dilauryl acid phosphite, trilauryl trithiophosphite, bis(neopentylglycol) 1,4-cyclohexanedimethyl diphosphite, bis(2,4-di-tert-butylphenyl) pentaerythritol diphosphite, bis(2,5-di-tert-butylphenyl)pentaerythritol diphosphite, bis(2,6-di-tert-butyl-4-methylphenyl)pentaerythritol diphosphite, bis(2,4-dicumylphenyl)pentaerythritol diphosphite, distearylpentaerythritol diphosphite, tetra(C12-15 mixed-alkyl)-4,4'-isopropylidenediphenyl phosphite, bis[2,2'-methylenebis(4,6-diamylphenyl)]isopropylidenediphenyl phosphite, tetratridecyl 4,4'-butylidenebis(2-tert-butyl-5-methylphenol) diphosphite, hexa(tridecyl) 1,1,3-tris(2-methyl-5-tert-butyl-4-hydroxyphenyl)butane triphosphite, tetrakis(2,4-di-tert-butylphenyl)biphenylene diphosphonite, tris(2-[(2,4,7,9-tetrakis-tert-butyldibenzo[d,f][1,3,2]dioxaphosphepin-6-yl)oxy]ethyl)amine, and 9,10-dihydro-9-oxa-10-phosphaphenanthrene-10-oxide, tris(2-[(2,4,8,10-tetrakis-tert-butyldibenzo[d,f][1,3,2]dioxaphosphepin-6-yl)oxy] ethyl)amine, 2-(1,1-dimethylethyl)-6-methyl-4-[[2,4,8, 10-tetrakis(1,1-dimethylethyl)dibenzo[d,f][1,3,2]

dioxaphosphepin-6-yl]oxy]propyl]phenol2-butyl-2-ethylpropanediol 2,4,6-tri-tert-butylphenol monophosphite.

Examples of the sulfur-based antioxidant may include dialkylthiodipropionates, β-alkylmercaptopropionic acid esters of polyol, and the like.

Here, dialkylthiodipropionates may be at least one of dilauryl thiodipropionic acid, dimyristyl thiodipropionic acid, myristylstearyl thiodipropionic acid, and distearylester thiodipropionic acid. Further, β-alkylmercaptopropionic acid esters of polyol may be pentaerythritoltetra(β-dodecyl mercaptopropionate).

The antioxidant included in the photosensitive resin composition according to the exemplary embodiment may be included in a content of 1 to 5 wt % based on a total weight of a solid of the photosensitive resin composition. Preferably, the antioxidant may be included in a content of 1 to 3 wt %, but the content is not limited thereto.

The photosensitive resin composition according to the exemplary embodiment may include the aforementioned antioxidant to have excellent heat resistance and chemical resistance. Thus, a quenching phenomenon caused by damage due to UV or heat generated during a patterning process of the nanophosphor can be prevented.

Generally, the photosensitive resin composition generates free radicals in a post-process step performed under a condition such as high temperatures, and thus heat resistance and chemical resistance of the composition and particularly the nanophosphor are reduced. Accordingly, a reduction phenomenon of a light quantity due to damage of the nanophosphor may occur. However, the photosensitive resin composition according to the exemplary embodiment of the present invention may further include the antioxidant to deactivate the free radicals and thus have excellent heat resistance and chemical resistance.

Specifically, the free radicals generated at high temperatures have good reactivity and thus react with ambient oxygen (refer to Reaction Equation 1), and the free radicals reacted with oxygen are bonded at a rapid speed with a hydroxy group of di-t-butylphenol that is a substituent group included in the antioxidant to be deactivated (refer to Reaction Equation 2).

$R.+O_2 \rightarrow ROO.R$ [Reaction Equation 1]

$ROO.+\text{hydroxy group of di-t-butylp} \rightarrow ROOH)$ [Reaction Equation 2]

The photosensitive resin composition according to the exemplary embodiment may further include a light scatterer. The light scatterer scatters incident light to increase the amount of light passing through a color filter or a color conversion layer formed of a photosensitive resin composition, and equalizes front luminance and side luminance.

The light scatterer may include at least one selected from TiO2, Al2O3, and SiO2.

The amount of light scatterer or the size of the light scatter is not specifically limited, and may be appropriately selected in consideration of a photosensitive resin composition. In this case, a diameter (nm) of the light scatterer may be 1/10 to 5 times a wavelength (nm) of light emitted of a layer made of the photosensitive resin composition for more efficient scattering of light emitted therefrom.

The photosensitive resin composition according to the exemplary embodiment may be used as a color filter composition.

Hereinafter, an experimental result illustrating change in light efficiency of the photosensitive resin composition according to the exemplary embodiment will be described with reference to FIGS. 1 and 3.

Figure 1B:
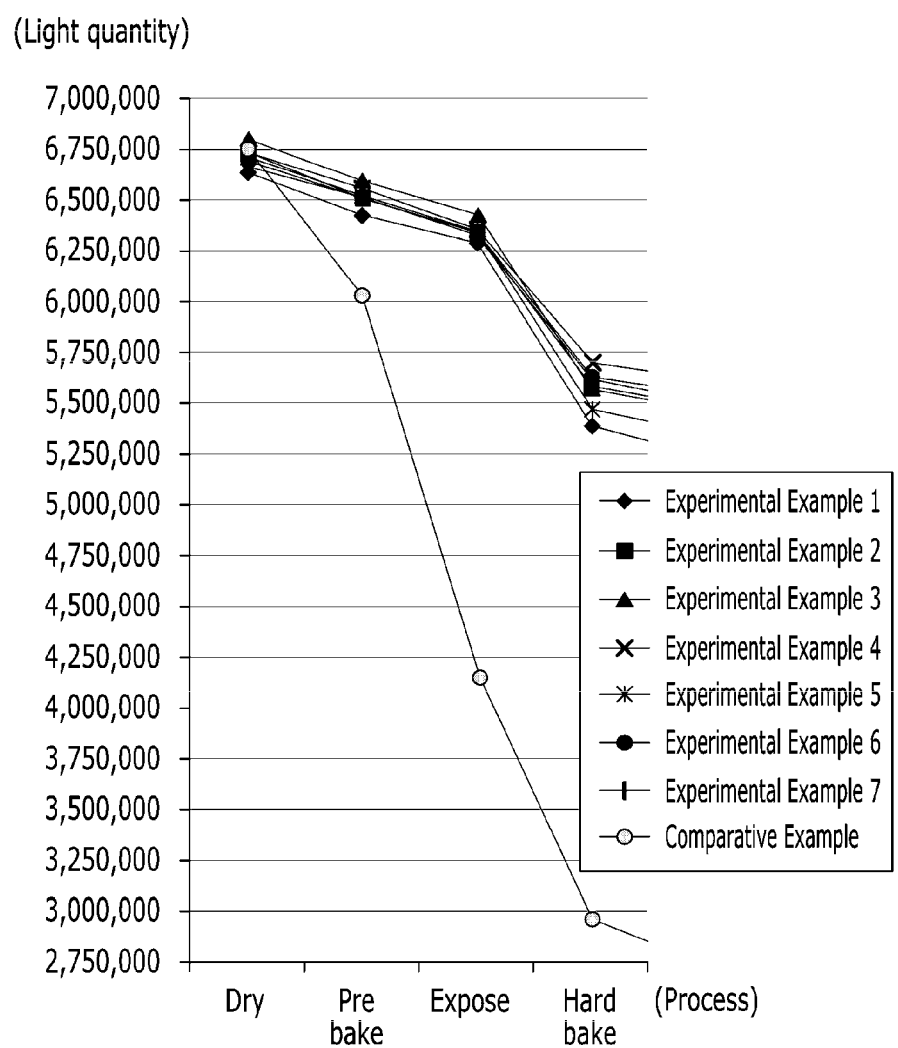
Figure 2A:
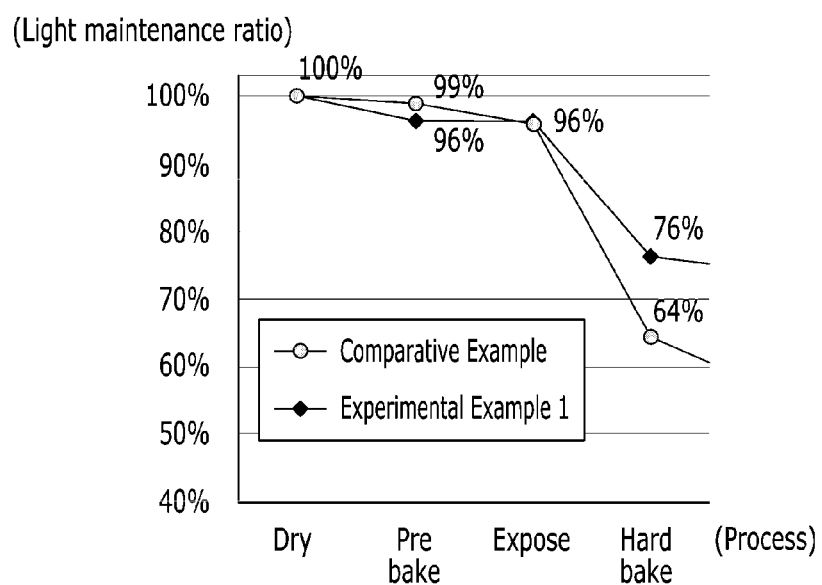
FIGS. 2A and 2B are graphs obtained by measuring a light maintenance ratio and a light quantity of red light according to the progression of the pattern process using the photosensitive resin compositions according to the exemplary embodiment (RS) and the Comparative Example (Ref) of the present inventive concept.
Figure 2B:
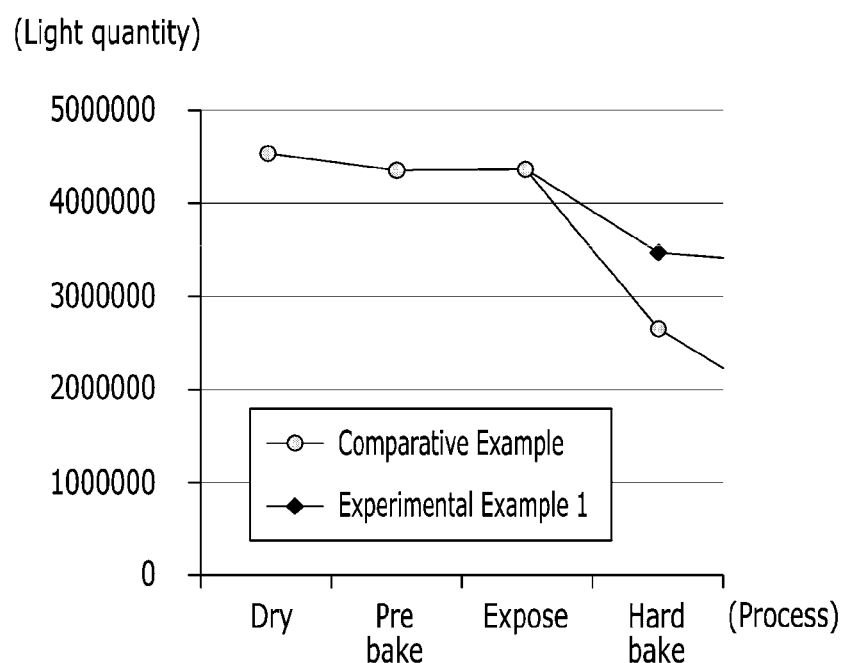

FIGS. 1A and 1B are graphs obtained by measuring a light maintenance ratio and a quantity of green light according to the progression of a process using photosensitive resin compositions according to an Experimental Example according to an exemplary embodiment and a Comparative Example, and FIGS. 2A and 2B are graphs obtained by measuring a light maintenance ratio and a quantity of red light according to the progression of the process using the photosensitive resin compositions according to the experimental example of the exemplary embodiment and the Comparative Example.

In order to measure light efficiency of a layer formed using the photosensitive resin composition according to the exemplary embodiment, after the layer was formed through the deposition process of the photosensitive resin composition, the light maintenance ratio and the light quantity of green wavelength and red wavelength bands were each measured.

The deposition process was performed according to application of the photosensitive resin composition on the substrate, drying at room temperature (15 to 25° C.) for 4 hours, the pre-bake process at 100° C. for 3 minutes, the UV exposure process of 400 mJ, and the hard-bake process at 180° C. for 30 minutes.

In the Comparative Example, the photosensitive resin composition not including the antioxidant was used, and the experiment was performed on a layer manufactured by using the photosensitive resin composition including the antioxidant of only the phenol-based compound in Experimental Example 1, the photosensitive resin composition including the antioxidant where the phenol-based and phosphorus-based compounds were mixed in Experimental Examples 2 to 5, and the photosensitive resin composition including the antioxidant where the phenol-based, phosphorus-based, and sulfur-based compounds were mixed in Experimental Examples 6 and 7.

Here, the antioxidants respectively used in Experimental Example 2 to Experimental Example 7 were manufactured according to a mixing ratio as shown in Table 1 relative to the total weight of antioxidant, and the phosphorus-based compounds used in Experimental Example 3 and Experimental Example 5 were included with the same amount, but the phosphorus-based compounds used in the respective examples were different from each other.

TABLE 1

| | Phenol-based (wt %) | phosphorous-based (wt %) | sulfur-based (wt %) |
|---|---|---|---|
| Experimental Example 2 | 70 | 30 | — |
| Experimental Example 3 | 50 | 50 | — |
| Experimental Example 4 | 30 | 70 | — |
| Experimental Example 5 | 50 | 50 | — |
| Experimental Example 6 | 40 | 50 | 10 |
| Experimental Example 7 | 30 | 50 | 20 |

First, referring to FIGS. 1A and 1B, it was confirmed that after the patterning process of the photosensitive resin composition was finished, the light quantity and the light maintenance ratio of the green wavelength band were about 80 to 85% as compared to initial light.

Referring to FIGS. 2A and 2B, the light maintenance ratio of the red wavelength band was measured by using the photosensitive resin composition of Experimental Example 1, and it was confirmed that after the patterning process of the photosensitive resin composition was finished, the light quantity and the light maintenance ratio of the red wavelength band were about 76% as compared to initial light.

On the other hand, referring to the experiment result of the Comparative Example illustrated in FIGS. 1A, 1B, 2A, and 2B, it can be confirmed that after the patterning process of the photosensitive resin composition is finished, the light quantity and the light maintenance ratio of the green wavelength band are at the level of 44% as compared to initial light, the light quantity and the light maintenance ratio of the red wavelength band are at the level of 64% as compared to initial light, and the light maintenance ratio of the photosensitive resin composition including the antioxidant of the present inventive concept is excellent.

Figure 3:
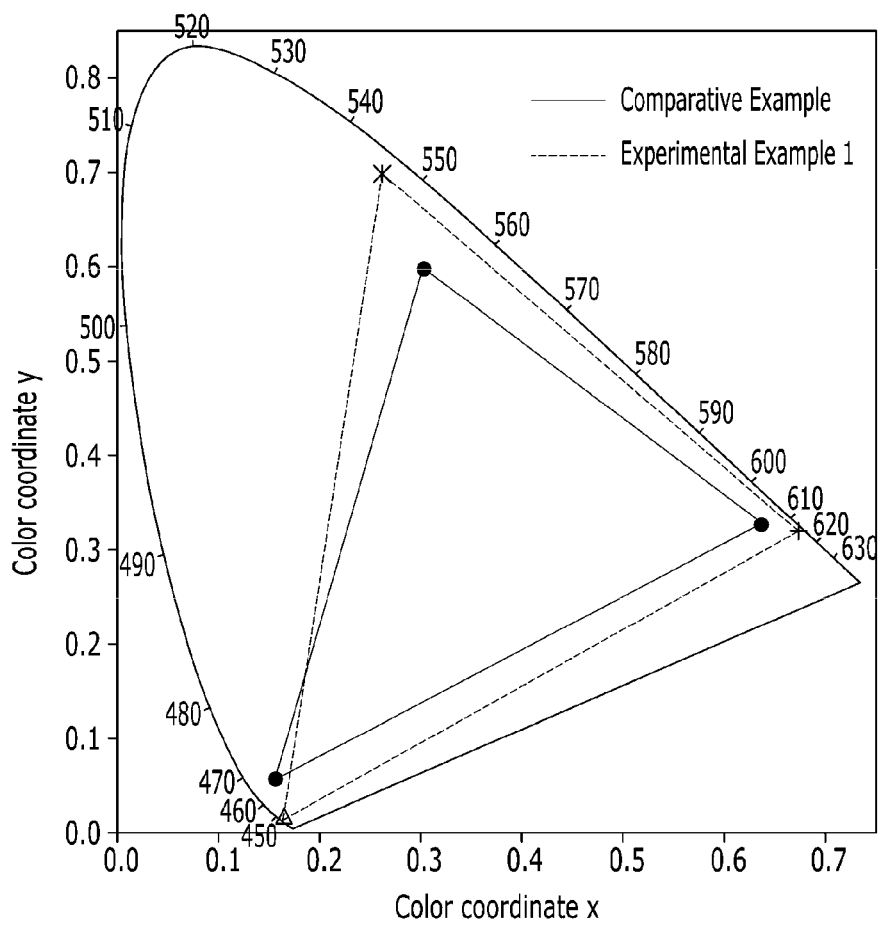
FIG. 3 is a graph obtained by measuring a color coordinate of a color filter using the photosensitive resin composition according to an exemplary embodiment of the present inventive concept.

In the case where the color filter manufactured by using the photosensitive resin composition according to the exemplary embodiment is used, a measurement result of color reproducibility will be reviewed with reference to FIG. 3.

FIG. 3 is a graph obtained by measuring a color coordinate of a color filter using the photosensitive resin compositions according to the Example (RS) and the Comparative Example (Ref).

As illustrated in FIG. 3, it can be confirmed that in the case where the color filter manufactured by using the photosensitive resin composition according to the exemplary embodiment of the invention is used, as compared to the color filter manufactured by using the photosensitive resin composition not including the antioxidant, a color coordinate region is expanded to allow improved color reproducibility.

Then, a display device including the color filter manufactured by using the photosensitive resin composition according to the exemplary embodiment will be described in detail with reference to FIGS. 4 and 5.

Figure 4:
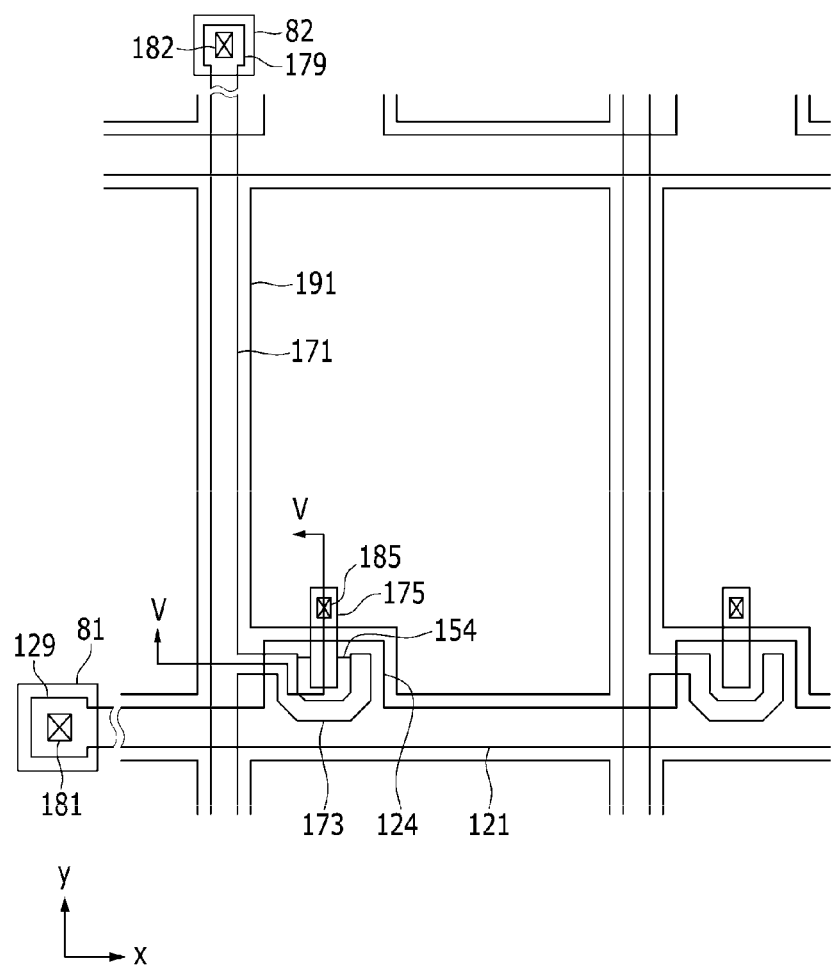
FIG. 4 is a top plan view illustrating a liquid crystal display device according to the exemplary embodiment of the present inventive concept.
Figure 5:
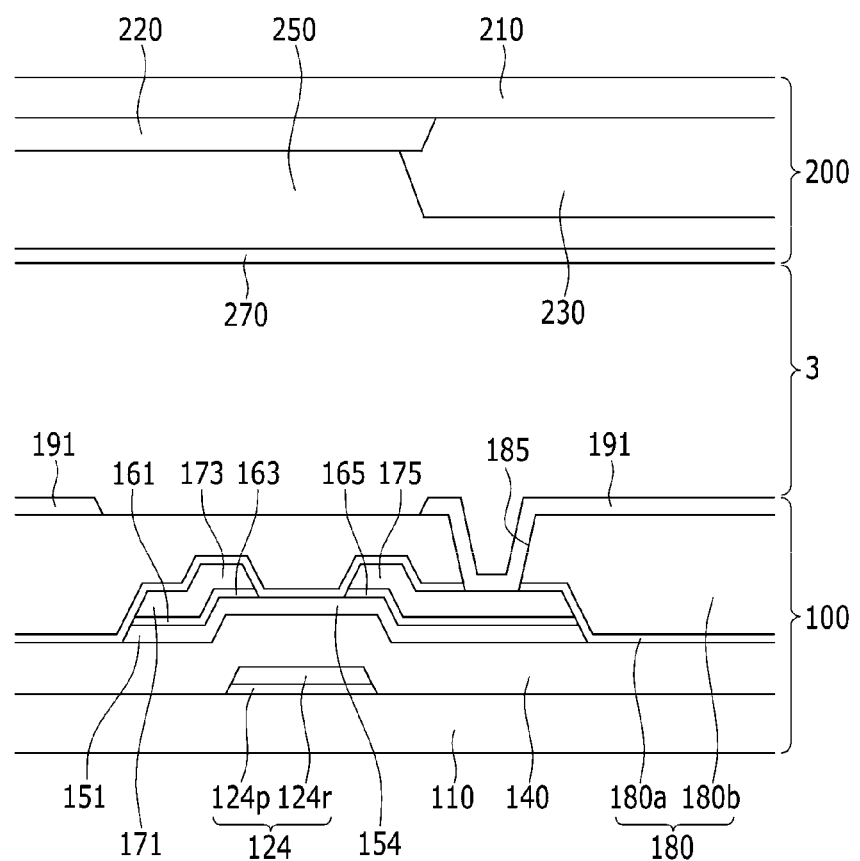
FIG. 5 is a cross-sectional view taken along line V-V of FIG. 4.

FIG. 4 is a top plan view illustrating a liquid crystal display according to the exemplary embodiment of the present invention, and FIG. 5 is a cross-sectional view taken along line V-V of FIG. 4.

Referring to FIGS. 4 and 5, the liquid crystal display according to the present exemplary embodiment includes a lower display panel 100 and an upper display panel 200, and a liquid crystal layer 3 interposed between two display panels 100 and 200.

First, the lower display panel 100 will be described.

A plurality of gate lines 121 is formed on an insulation substrate 110 made of transparent glass or plastic.

The gate line 121 transfers a gate signal and mainly extends in an X-axis direction. Each gate line 121 includes a plurality of gate electrodes 124 that protrudes from the gate line 121 and a wide end portion 129 for connection with another layer or a gate driver (not illustrated).

The gate electrode 124 has a dual-layer structure formed of a lower layer 124p and an upper layer 124r. The lower layer 124p may be formed of any one of titanium, tantalum, molybdenum, and alloys thereof, and the upper layer 124r may be formed of copper (Cu) or a copper alloy. Further, the gate line 121 and the end portion 129 of the gate line 121 may also be formed of a dual-layer of a lower layer and an upper layer. In the present exemplary embodiment, it is described that the gate line 121 and the gate electrode 124 have the dual-layer structure, but the gate line 121 and the gate electrode 124 may have a single-layered structure.

A gate insulating layer 140 made of an insulating material such as silicon nitride or silicon oxide is formed on the gate line 121.

A semiconductor layer 151 made of hydrogenated amorphous silicon, polysilicon, or the like is formed on the gate insulating layer 140. The semiconductor layer 151 mainly extends in a direction in which the data line 171 extends, and includes a plurality of projections 154 extending toward the gate electrode 124.

An ohmic contact stripe 161 and an ohmic contact island 165 are provided on the semiconductor layer 151. The ohmic contact stripe 161 has a projection 163, and the projection 163 and the ohmic contact island 165 form a pair and are disposed on the projection 154 of the semiconductor layer 151.

The ohmic contact stripe 161 overlaps the data line 171, the projection 163 of the ohmic contact stripe 161 overlaps the source electrode 173, and the ohmic contact island 165 overlaps the drain electrode 175.

The source electrode 173 connected to the data line 171 and the drain electrode 175 facing the source electrode 173 are disposed on the ohmic contacts 161 and 165 and the gate insulating layer 140.

The data line 171 transports a data signal and mainly extends in a Y-axis direction to cross the gate line 121. The source electrode 173 may extend toward the gate electrode 124 to have a U shape, but this is just an example, and the source electrode 173 may have the variously modified shapes.

The drain electrode 175 is separated from the data line 171, and extends upwardly from the middle of the U-shaped source electrode 173. The data line 171 includes an end portion 179 having a wide area for connection with another layer or the data driver (not illustrated).

Although not illustrated in the drawings, the data line 171, the source electrode 173, and the drain electrode 175 may have a dual-layer structure of an upper layer and a lower layer. The upper layer may be formed of copper (Cu) or a copper alloy, and the lower layer may be formed of any one of titanium (Ti), tantalum (Ta), molybdenum (Mo), and alloys thereof.

The data line 171, the source electrode 173, and the drain electrode 175 may have a tapered lateral surface.

The ohmic contacts 161, 163, and 165 exist only between the semiconductors 151 and 154 therebeneath and the data line 171 and the drain electrode 175 thereon, and reduce contact resistance therebetween. Further, the ohmic contacts 161, 163, and 165 may have substantially the same plane pattern as the data line 171, the source electrode 173, and the drain electrode 175.

In the projection 154 of the semiconductor layer 151, there is an exposed portion that is not covered by the data line 171 and the drain electrode 175, in addition to a portion between the source electrode 173 and drain electrode 175. The semiconductor layer 151 has substantially the same plane pattern as the ohmic contacts 161, 163, and 165 except for the exposed portion of the projection 154.

One gate electrode 124, one source electrode 173, and one drain electrode 175 form one thin film transistor (TFT) together with the projection 154 of the semiconductor layer 151, and the channel of the thin film transistor is formed in the projection 154 of the semiconductor layer 151 between the source electrode 173 and the drain electrode 175.

A passivation layer 180 including a first passivation layer 180a and a second passivation layer 180b is formed on the data line 171, the drain electrode 175, and the exposed portion of the projection 154 of the semiconductor layer. The passivation layer 180 may be formed of an inorganic insulator such as silicon nitride or silicon oxide.

A first contact hole 181 through which an end portion 129 of the gate line 121 is exposed is formed in the passivation layer 180 and the gate insulating layer 140. Further, a second contact hole 182 through which an end portion 179 of the data line 171 is exposed and a third contact hole 185 through which an end of the drain electrode 175 is exposed are formed in the passivation layer 180.

A pixel electrode 191, a first contact assistant 81, and a second contact assistant 82 are provided on the passivation layer 180. The pixel electrode 191 and the contact assistants 81 and 82 may be made of a transparent conductive material such as ITO or IZO, or reflective metal such as aluminum, silver, chromium, or an alloy thereof.

The pixel electrode 191 is physically electrically connected to the drain electrode 175 through the third contact hole 185, and receives a data voltage from the drain electrode 175.

The first contact assistant 81 is connected with the end portion 129 of the gate line 121 through the first contact hole 181, and the second contact assistant 82 is connected with the end portion 179 of the data line 171 through the second contact hole 182. The first and second contact assistants 81 and 82 complement adherence between the end portion 129 of the gate line 121 and the end portion 179 of the data line 171 and an external device, and protect the end portions.

Although it is not illustrated, an alignment layer may be provided on the pixel electrode 191.

Next, the upper display panel 200 will be described.

A light blocking layer 220 is provided on one side of the upper substrate 210, facing the lower substrate 110 that is made of glass, plastic, or the like. That is, the light blocking layer 220 is provided below the upper substrate 210. The light blocking layer 220 blocks light leakage that may occur between neighboring pixel areas.

A color filter 230 is provided on one side of the upper substrate 210, facing the lower substrate 110. That is, the color filter 230 is provided below the upper substrate 210. An edge portion of the color filter 230 may overlap the light blocking layer 220. The color filter 230 may be mainly present in the region surrounded by the light blocking layer 220, and may longitudinally extend along a column of the pixel electrodes 191. Each color filter 230 may display any one of primary colors such as three primary colors of red, green, and blue colors.

The color filter 230 may be formed of the aforementioned photosensitive resin composition according to the exemplary embodiment of the inventive concept.

The photosensitive resin composition included in the color filter 230 of the liquid crystal display according to the present exemplary embodiment includes a quantum dot that can implement a wide viewing angle by a lambertian scattering state, and accordingly a viewing angle of the liquid crystal display can be improved.

In the present exemplary embodiment, it is described that the light blocking layer 220 and the color filter 230 are formed in the upper display panel 200, but at least one of the light blocking layer 220 and the color filter 230 may be formed in the lower display panel 100.

For example, the color filter 230 may be formed instead of the second passivation layer 180*b* formed in the lower display panel 100, and in this case, the color filter 230 may not be formed in the upper display panel 200.

An overcoat layer 250 is disposed on one side of the color filter 230 and one side of the light blocking layer 220, which face the lower substrate 110. That is, as shown in the drawing, the overcoat layer 250 is disposed below the color filter 230 and the light blocking layer 220. The overcoat layer 250 may be made of an (organic) insulating material, and prevents exposure of the color filter 230 and provides a flat surface. The overcoat layer 250 may be omitted.

A common electrode 270 is disposed on one side of the overcoat layer 250, which faces the lower substrate 110. That is, the common electrode 270 is provided between the overcoat layer 250 and the liquid crystal layer 3. The common electrode 270 is made of a transparent conductor such as ITO or IZO, and receives a common voltage Vcom.

Although not shown in the figures, an alignment layer may be disposed between the common electrode 270 and the alignment layer 3.

The liquid crystal layer 3 interposed between the lower display panel 100 and the upper display panel 200 includes liquid crystal molecules having a negative dielectric anisotropy or a positive dielectric anisotropy, and the liquid crystal molecules may be aligned so that long axes thereof are vertical in respect to the surfaces of two display panels 100 and 200 in a state in which there is no electric field.

The pixel electrode 191 and the common electrode 270 form a liquid crystal capacitor together with a portion of the liquid crystal layer 3 therebetween to maintain the applied voltage even after the thin film transistor is turned off.

The pixel electrode 191 may overlap with a storage electrode line (not illustrated) to form a storage capacitor, and a voltage storage ability of the liquid crystal capacitor may be increased therethrough.

As shown in FIG. 4 and FIG. 5, the common electrode 27 may be disposed in the lower display panel 100, and in this case, liquid crystal molecules included in the liquid crystal layer 3 are aligned so that the long axes thereof are horizontally parallel with the surfaces of the two panels 100 and 200 without applying an electric field.

Until now, the exemplary embodiment where the photosensitive layer resin composition according to the exemplary embodiment is used in the color filter of the liquid crystal display illustrated in FIGS. 4 and 5 is described, but the photosensitive layer resin composition according to the exemplary embodiment can be applied to all display devices in which the color filter can be used.

Hereinafter, a color conversion panel according to an exemplary embodiment of the inventive concept will be described with reference to FIG. 6.

Figure 6:
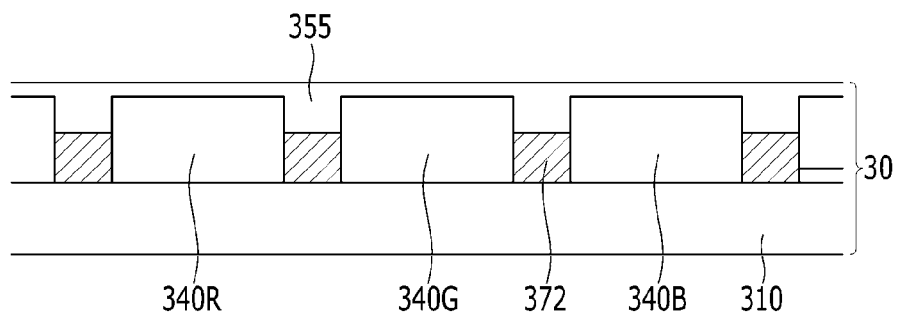
FIG. 6 is a cross-sectional view of a color conversion panel according to an exemplary embodiment of the present inventive concept.

FIG. 6 is a cross-sectional view of a color conversion panel according to an exemplary embodiment of the present invention.

As shown in FIG. 6, a color conversion panel 30 includes a first color conversion layer 340R, a second color conversion layer 340G, and a transmission layer 340B provided on a first substrate 310.

The first color conversion layer 340R, the second color conversion layer 340G, and the transmission layer 340B may be made of the photosensitive layer resin composition according to the above-stated exemplary embodiment of the present inventive concept.

Here, the first color conversion layer 340R may be a red conversion layer, and the second color conversion layer 340G may be a green conversion layer.

The first color conversion layer 340R and second color conversion layer 340G may include a quantum dot that converts colors or an inorganic phosphor, and the transmission layer 340B is made of a transparent polymer without including an inorganic phosphor and a quantum dot and thus light of blue supplied from a backlight assembly is directly transmitted, thereby displaying a blue color.

A light blocking member 372 may be provided respectively between the first color conversion layer 340R and the second color conversion layer 340G, between the first color conversion layer 340R and the transmission layer 340B, and between the second color conversion layer 340G and the transmission layer 340B.

The light blocking member 372 may partition areas where the first color conversion layer 340R, the second color conversion layer 340G, and the transmission layer 340B are respectively disposed. The light blocking member 372 prevents color mixing between adjacent color conversion layers 340R and 304G and transmission layers 340B.

A planarization layer 355 that provides a flat surface may be provided on the first and second color conversion layers and the transmission layer 340R, 340G, and 340B, but the planarization layer 355 may be omitted as necessary.

Hereinafter, a liquid crystal display according to an exemplary embodiment will be schematically described with reference to FIG. 7.

Figure 7:
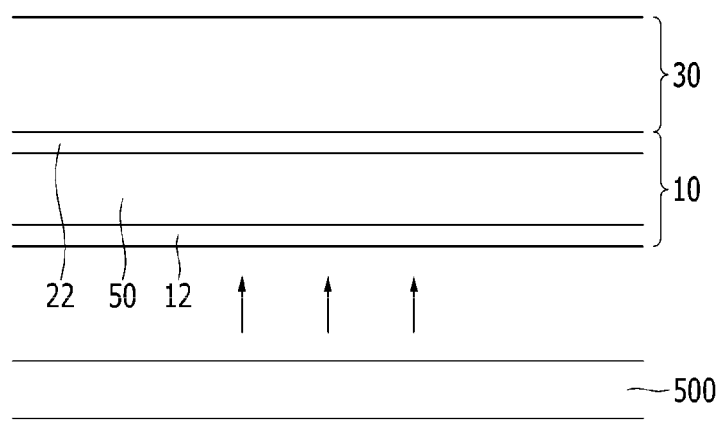
FIG. 7 is a schematic cross-sectional view of a display device according to an exemplary embodiment of the present inventive concept.

FIG. 7 is a schematic cross-sectional view of a display device according to an exemplary embodiment of the present inventive concept.

Referring to FIG. 7, a display device according to an exemplary embodiment includes a color conversion panel 30, a display panel 10, and a light assembly 500. The color conversion panel 30 included in the display device according to the exemplary embodiment is the same as the color conversion panel 30 according to the exemplary embodiment of FIG. 6, and therefore, a duplicated description of like elements will be omitted. However, like the color conversion panel 30 of FIG. 6, a first substrate 310 and the display panel 10 may be disposed to contact each other, or a planarizaton layer 355 and the display panel 10 may be disposed while contacting each other.

The display panel 10 disposed in one side of the color conversion panel 30 may include a liquid crystal panel 50 and polarizing plates 12 and 22 respectively disposed on lateral sides of the liquid crystal panel 50. That is, a first polarizing plate 12 and a second polarizing plate 22 are provided on lateral sides of the liquid crystal panel 50 to polarize incident light from a backlight assembly 500. The first polarizing plate 12 may face the backlight assembly 500, and the second polarizing plate 22 may face or contact the color conversion panel 30.

The backlight assembly 500 may include a light source and a light guiding panel (not shown) disposed on a bottom surface of the first polarizing plate 12 and guides light generated from the light source to a direction of the display panel 10 and the color conversion panel 30.

For example, the backlight assembly 500 may include at least one light emitting diode, and the light emitting diode may be a blue light emitting diode or a UV light source. The light source according to the present exemplary embodiment may be an edge-type backlight assembly disposed in at least one side of the light guiding panel or a direct-type backlight assembly of which the light source of the backlight assembly 500 is disposed below a light guiding panel (not shown), but this is not restrictive. The light source may be disposed in any position.

Next, a liquid crystal display device, which is an example of the above-stated display panel, will be described in detail with reference to FIG. 8 and FIG. 9.

Figure 8:
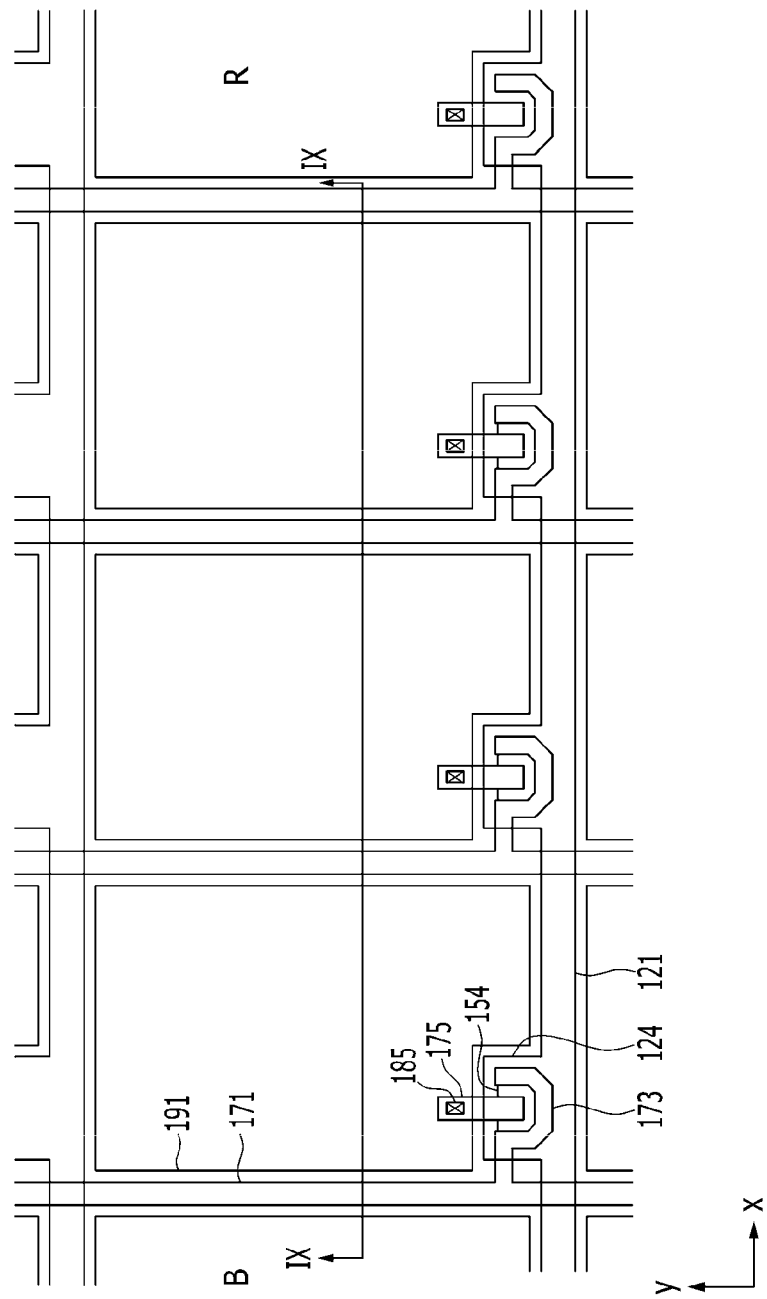
FIG. 8 is a top plan view of a plurality of pixels in a liquid crystal display according to an exemplary embodiment of the present inventive concept.
Figure 9:
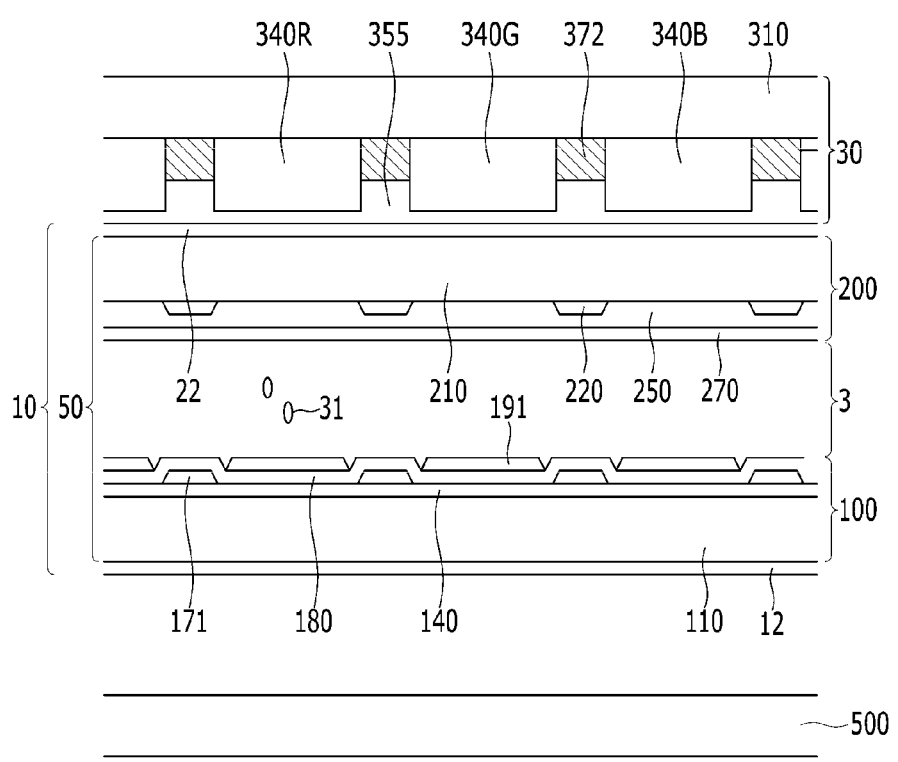
FIG. 9 is a cross-sectional view of FIG. 8, taken along the line IX-IX.

FIG. 8 is a top plan view of a plurality of pixels of a liquid crystal display according to an exemplary embodiment of the inventive concept and FIG. 9 is a cross-sectional view of FIG. 8, taken along the line IX-IX.

A color conversion panel 30 shown in FIG. 8 to FIG. 9 is the same as the color conversion panel 30 according to the exemplary embodiment of FIG. 6, and any redundant description will be omitted.

A liquid crystal panel 50 disposed on one side of the color conversion panel 30 includes a lower display panel including a thin film transistor and a lower substrate 100, an upper display panel 200 facing the lower display panel 100 and including an upper substrate 210, and a liquid crystal layer 3 provided between the lower display panel 100 and the upper display panel 200 for displaying an image.

First and second polarizing plates 12 and 22 are respectively disposed on lateral sides of the liquid crystal panel 50, and in this case, the polarizing plates 12 and 22 may be one or more of a coated-type polarizer, an adhesion-type polarizer, and a wire grid polarizer. The polarizing plates 12 and 22 may be disposed on one side of the liquid crystal panel 50 with various methods such as a film form, a coating form, an attachment form, and the like.

A plurality of pixel electrodes may be arranged in a matrix configuration on the lower substrate 110 of the lower display panel 100.

On the lower substrate 110, a gate line 121 extends in the X-axis direction and includes a gate electrode 124, a gate insulating layer 140 is disposed on the gate line 121, a semiconductor layer 154 is disposed on the gate insulating layer 140, a data line 171 and a drain electrode 175 are disposed on the semiconductor layer 154 and extend in the Y-axis direction, a passivation layer 180 is provided on the data line 171 and the drain electrode 175. The pixel electrodes 191 are physically and electrically connected with the drain electrode 175 through a contact hole 185.

The semiconductor layer 154 disposed on the gate electrode 124 forms a channel layer in an area exposed by the source electrode 173 and the drain electrode 175, and the gate electrode 124, the semiconductor layer 154, the source electrode 173, and the drain electrode 175 form a single thin film transistor.

A light blocking layer 220 is disposed on one side of the upper substrate 210 facing the lower substrate 110. An overcoat layer 250 providing a flat surface may be disposed on the light blocking layer 220 facing the lower substrate 110, and a common electrode 270 is disposed on the overcoat layer 250 that faces the lower substrate 110. The overcoat layer 250 may be omitted depending on an exemplary embodiment. The common electrode 270 may be provided in the lower display panel 100.

The common electrode 270 receiving a common voltage forms an electric field with the pixel electrode 191 such that liquid crystal materials 31 included in the liquid crystal layer 3 are arranged.

The liquid crystal layer 3 includes a plurality of liquid crystal material 31, and an alignment direction of the liquid crystal materials 31 is controlled by the electric field between the pixel electrode 191 and the common electrode 270. Light transttance of the light received from the backlight assembly 50 can be controlled by controlling the alignment of the light crystal materials 31 such that an image can be displayed.

Further, although not illustrated in the figures, an alignment layer may be disposed between the pixel electrode 191 and the liquid crystal layer 3 and between the common electrode 270 and the liquid crystal layer 3.

A planarization layer 355 of the color conversion panel 30 may be disposed facing the upper substrate 210 of the display panel 10.

Figure 10:
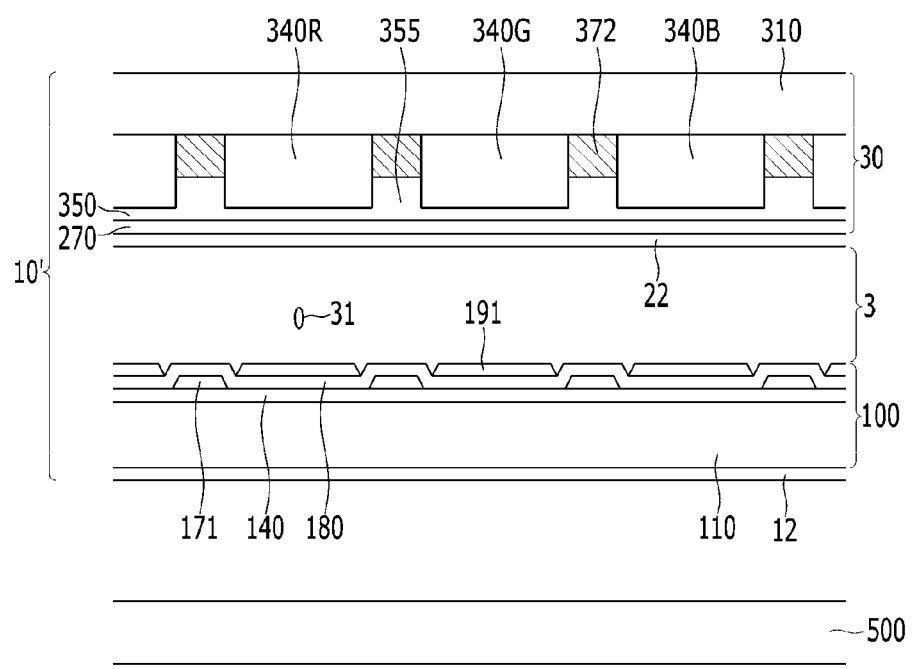
FIG. 10 is a cross-sectional view of an exemplary variation of the exemplary embodiment of FIG. 9.

Referring to FIG. 10, an exemplary variation of the exemplary embodiment that has been described with reference to FIG. 8 and FIG. 9 will now be described.

FIG. 10 is a cross-sectional view of another exemplary embodiment of FIG. 8, taken along the line IX-IX.

An exemplary embodiment described with reference to FIG. 10 is the same as the exemplary embodiment of FIG. 9, except for an upper display panel 300. Any redundant description will be omitted.

As shown in FIG. 10, a display panel 10 according to the present exemplary embodiment includes a lower display panel 100, a color conversion panel 30 separated from the lower display panel 100 while facing the same, and a liquid crystal layer 3 provided between the lower display panel 100 and the color conversion panel 30. That is, unlike the exemplary embodiment described with reference to FIG. 8 and FIG. 9, instead of the upper display panel 200, the color conversion panel 40 partially forms the display panel 10 according to the exemplary embodiment of FIG. 10.

The display panel 10 may further include a first polarizing plate 12 provided on one side of the lower display panel 100 and a second polarizing plate 22 provided on the other side of the lower display panel 100.

Here, the second polarizing plate 22 may be disposed between the color conversion panel 30 and the liquid crystal layer 3.

Further, although it is not illustrated, an alignment layer may be provided between a pixel electrode 191 and the liquid crystal layer 3 and between the second polarizing plate 22 and the liquid crystal layer 3.

The liquid crystal display according to the present exemplary embodiment can improve a light quantity and color reproducibility through a color conversion panel that is disposed on the display panel and includes a color conversion layer that includes an inorganic phosphor or a quantum dot that can have a lambertian scattering state.

Hereinafter, referring to FIG. 11 to FIG. 13, a liquid crystal display, which is an exemplary embodiment of the present inventive concept, will be described in detail.

Figure 11:
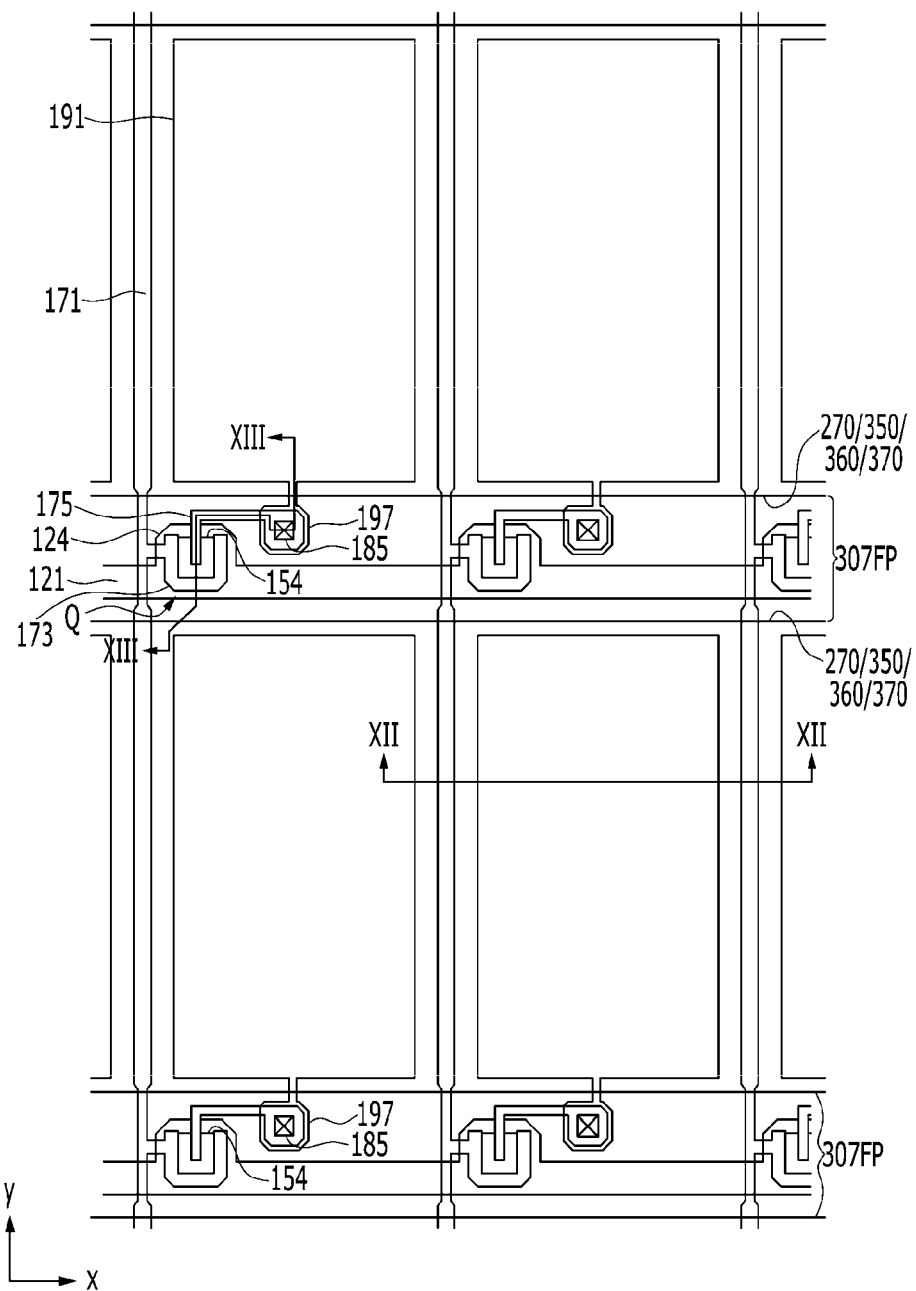
FIG. 11 is a top plan view of a plurality of pixels in a liquid crystal display according to an exemplary embodiment of the present inventive concept.
Figure 12:
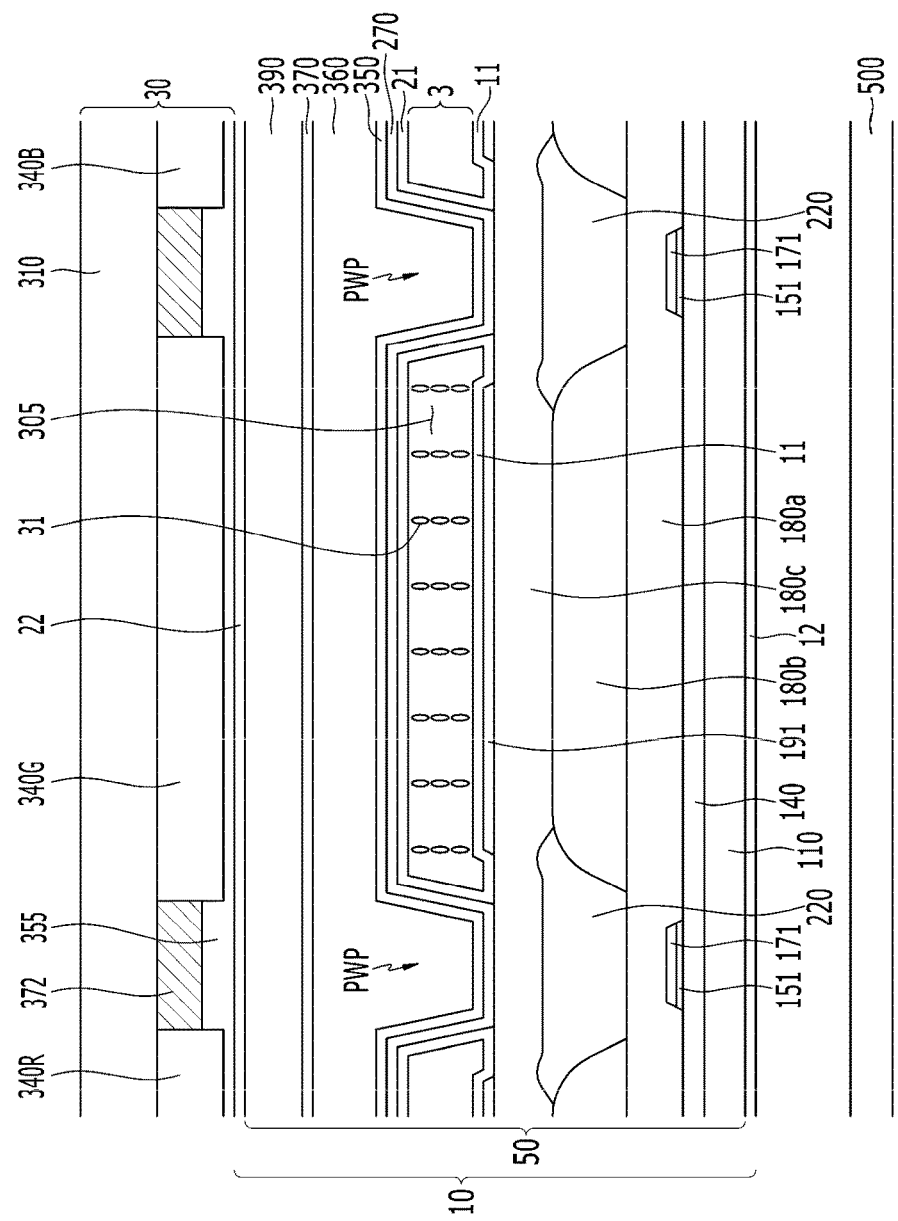
FIG. 12 is a cross-sectional view of FIG. 11, taken along the line XII-XII.
Figure 13:
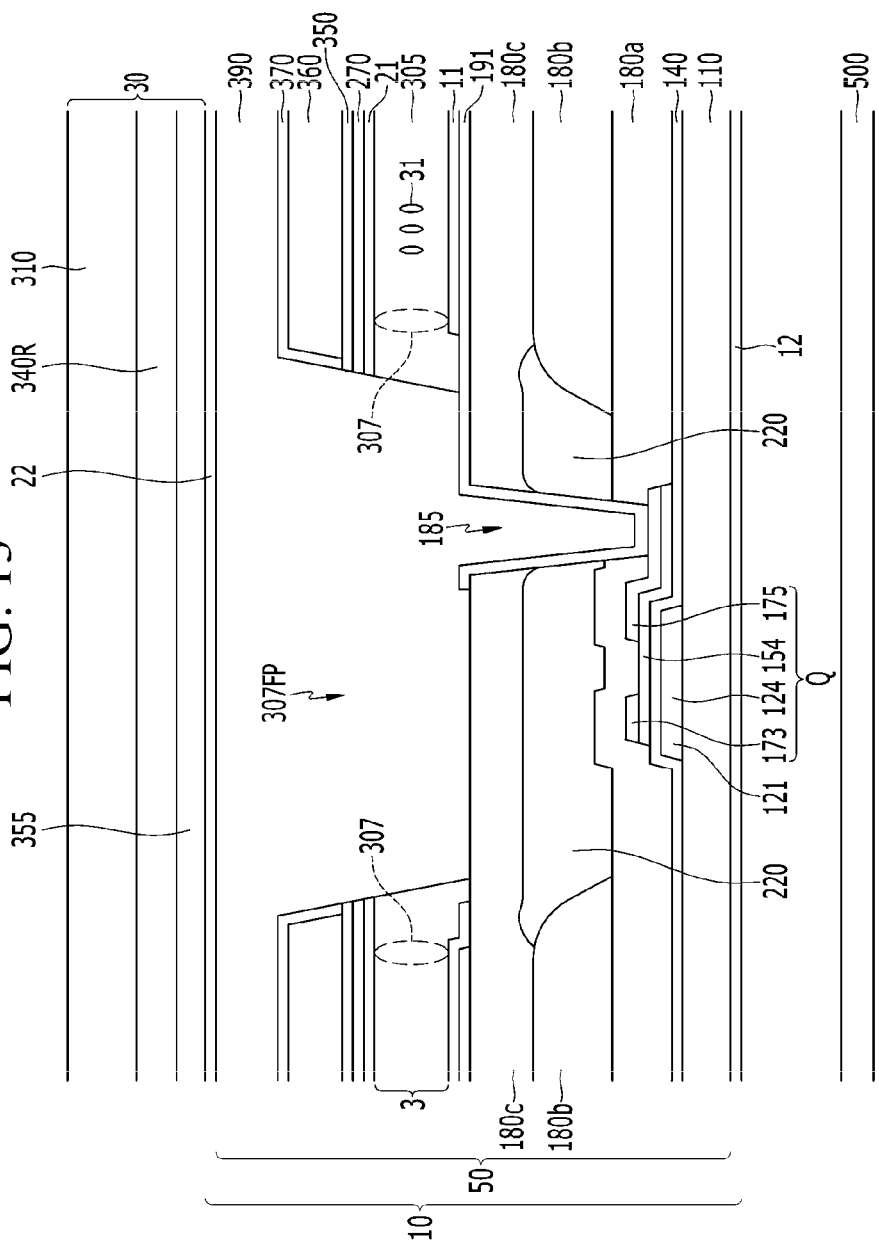
FIG. 13 is a cross-sectional view of FIG. 11, taken along the line XIII-XIII.

FIG. 11 is a top plan view of a plurality of pixels in a liquid crystal display according to an exemplary embodiment, FIG. 12 is a cross-sectional view of FIG. 11, taken along the line XII-XII, and FIG. 13 is a cross-sectional view of FIG. 11, taken along the line XIII-XIII.

A color conversion panel 30 shown in FIG. 11 to FIG. 13 is the same as the color conversion panel 30 according to the exemplary embodiment of FIG. 6, and therefore, any redundant description will be omitted.

Referring to FIG. 11 to FIG. 13, a liquid crystal display according to an exemplary embodiment includes a display panel 10, a color conversion panel 30, and a backlight assembly 500. The display panel 10 may be disposed on the backlight assembly 500 and the color conversion panel 30 may be disposed on the display panel 10.

The display panel 10 according to the exemplary embodiment of the inventive concept may include a liquid crystal panel 50 and first and second polarizing plates 12 and 22 provided at lateral sides of the liquid crystal panel 50. In this case, the polarizing plates 12 and 22 may be one or more of a coated-type polarizer, an adhesion-type polarizer, and a wire grid polarizer, and may be disposed in both sides of the liquid crystal panel 50 with various methods such as a film form, a coating form, an attachment form, and the like.

FIG. 11 illustrates 2*2 pixels among a plurality of pixels, and in the liquid crystal display according to the present exemplary embodiment, such a pixel format may be arranged to repeat vertically and horizontally.

Referring to FIG. 11 to FIG. 13, in the liquid crystal panel 50, a gate line 121 is disposed on a substrate 110. The gate line 121 includes a gate electrode 124.

A gate insulating layer 140 is provided on the gate line 121. A semiconductor layer 151 disposed below the data line 171 and a semiconductor layer 154 disposed below source/drain electrodes 173 and 175 and in a channel portion of a thin film transistor Q are provided on the gate insulating layer 140.

Although it is not illustrated, a plurality of ohmic contact members may be provided respectively above the semiconductors 151 and 154 and between the data line 171 and the source/drain electrodes 173 and 175.

Data conductors 171, 173, and 175 including the source electrode 173, the data line 171 connected with the source electrode 173, and the drain electrode 175 are provided on each of the semiconductor layers 151 and 154 and the gate insulating layer 140.

The gate electrode 124, the source electrode 173, and the drain electrode 175 form a thin film transistor Q together with the semiconductor layer 154, and a channel of the thin film transistor Q is formed in a portion of the semiconductor layer 154 between the source electrode 173 and the drain electrode 175.

A first passivation layer 180a may be disposed on the data conductors 171, 173, and 175 and an exposed portion of the semiconductor layer 154. The first passivation layer 180a may include an inorganic insulating material such as silicon nitride (SiNx) or silicon oxide (SiOx) or an organic insulating material.

A second passivation layer 180b and a light blocking layer 220 are disposed on the first passivation layer 180a.

First, the light blocking layer 220 is formed with a lattice structure having an opening that corresponds to an image displaying area, and is made of a material through which light cannot be transmitted. The second passivation layer 180b is provided in the opening of the light blocking layer 220. The light blocking layer 220 includes a vertical light blocking member formed along the X-axis direction that is parallel with the gate line 121 and a vertical light blocking member formed along the Y-axis direction that is parallel with the data line 171.

The second passivation layer 180b may include an inorganic insulating material such as silicon nitride (SiNx) or silicon oxide (SiOx) or an organic insulating material.

A third passivation layer 180c is provided on the second passivation layer 180b and the light blocking layer 220 to cover them. The third passivation layer 180c may include an inorganic insulating material such as silicon nitride (SiNx) or silicon oxide (SiOx) or an organic insulating material.

When a step is generated due to a thickness difference between the second passivation layer 180b and the light blocking layer 220, the step may be reduced or removed by controlling the third passivation layer 180c to include an organic insulating material.

A contact hole 185 that exposes the drain electrode 175 is formed in the first to third passivation layers 180a, 180b, and 180c and the light blocking layer 220.

A pixel electrode 191 is disposed on the third passivation layer 180c. The pixel electrode 191 may be made of a transparent conductive material such as ITO or IZO.

The general shape of the pixel electrode 191 may be a quadrangle.

The pixel electrode 191 includes a projection 197 extending toward the gate line 121, is physically and electrically connected with the drain electrode 175 through the contact hole 185 in the projection 197, and receives a data voltage from the drain electrode 175.

The description of the thin film transistors Q and the pixel electrode 191 described above is one example, and the structure of the thin film transistors and the design of the pixel electrode may be modified to enhance side visibility rather than being limited by the above-described structure.

A lower alignment layer 11 is disposed on the pixel electrode 191, and the lower alignment layer 11 may be a vertical alignment layer. The lower alignment layer 11 is a liquid crystal alignment layer such as polyamic acid, polysiloxane, or polyimide, and may be formed by including at least one of generally used materials.

An upper alignment layer 21 is disposed in a portion facing the lower alignment layer 11, and a plurality of microcavities 305 are formed between the lower alignment layer 11 and the upper alignment layer 21. The liquid crystal layer 3 is disposed in the microcavities 305. The liquid crystal layer 3 includes liquid crystal material 31, and the liquid crystal material 31 may be injected through an inlet 307 provided at an edge of the microcavity 305. The microcavity 305 may be provided in plural along a column direction, that is, a vertical direction of the pixel electrode 191. In the present exemplary embodiment, the liquid crystal material 31 including an alignment material forming the alignment layers 11 and 21 and the liquid crystal material 31 including liquid crystal molecules may be injected to the microcavity using capillary force. In the present exemplary embodiment, the lower alignment layer 11 and the upper alignment layer 21 are distinguished according to locations, and as shown in FIG. 12, they may be connected to each other. The lower alignment layer 11 and the upper alignment layer 21 may be simultaneously formed.

The microcavities 305 are divided in a vertical direction by a plurality of trenches 307FP provided in portions that overlap the gate line 121 such that the plurality of microcavities 305 are formed, and the plurality of microcavities 305 may be disposed along a column direction, that is, a vertical direction of the pixel electrode 191. The trenches 307FP are formed through a manufacturing process, but a capping layer 390 may be disposed in a final structure. Further, the microcavities 305 are divided along X-axis direction by partitioning wall portions PWP, and the plurality of microcavities 305 may be formed along the X-axis direction of the pixel electrode 191. Each of the microcavities 305 may correspond to one pixel or two pixel areas, and each pixel area may correspond to an area displaying an image.

The common electrode 270 and a lower insulation layer 350 are provided on the upper alignment layer 21. The common electrode 270 receives a common voltage, and generates an electric field together with the pixel electrode 191 to which a data voltage is applied to determine a direction in which the liquid crystal materials 31 in the microcavity 305 are inclined. The common electrode 270 forms a capacitor with the pixel electrode 191 and maintains a voltage applied thereto after a thin film transistor is turned off. The lower insulation layer 350 may be made of silicon nitride (SiNx) or silicon oxide ($SiO_2$).

In the present exemplary embodiment, the common electrode 270 is provided above the liquid crystal layer 3, but the common electrode 270 may be disposed below the microcavity 305, thereby enabling liquid crystal driving according to a coplanar electrode (CE) mode according to another exemplary embodiment of the present inventive concept.

A roof layer 360 is provided on the lower insulation layer 350. The roof layer 360 serves to support formation of the microcavity 350, which is a space between the pixel electrode 191 and the common electrode 270. The roof layer 360 may include a photoresist or other organic material.

An upper insulation layer 370 is provided on the roof layer 360. The upper insulation layer 370 may contact the upper surface of the roof layer 360.

In the present exemplary embodiment, as shown in FIG. 12, the partitioning wall portions PWP are provided between microcavities 350 that neighbor in the horizontal direction. The partitional wall portion PWP may be formed along the Y-axis direction in which the data line 171 extends, and may be covered by the roof layer 360. The partitioning wall portion PWP is filled with the common electrode 270, the lower insulation layer 350, the roof layer 360, and the upper insulation layer 370, and such a structure forms a partition wall to partition or define the microcavity 305.

As shown in FIG. 13, the upper insulation layer 370 may cover a side surface of the roof layer 360, and as an exemplary variation, a side wall of the lower insulation layer 350, a side wall of the roof layer 360, and a side wall of the upper insulation layer 370 may be substantially equally aligned with each other.

The capping layer 390 is provided on the upper insulation layer 370. The capping layer 390 includes an organic material or an inorganic material. In the present exemplary embodiment, the capping layer 390 may be disposed not only in the upper insulation layer 370 but also in the liquid crystal inlet 307FP. In this case, the capping layer 390 may cover the inlet 307 of the microcavity 305, exposed by the liquid crystal inlet 307FP.

A planarization layer 355 of the color conversion panel 30 is disposed while facing the capping layer 390 of the display panel 10.

The display device according to the present exemplary embodiment can improve a light quantity and color reproducibility through a color conversion panel that is disposed on the display panel and includes a color conversion layer that includes an inorganic phosphor or a quantum dot that can have a lambertian scattering state.

Hereinafter, an organic light emitting display device according to an exemplary embodiment of the present invention will be described with reference to FIG. 14 to FIG. 15.

Figure 14:
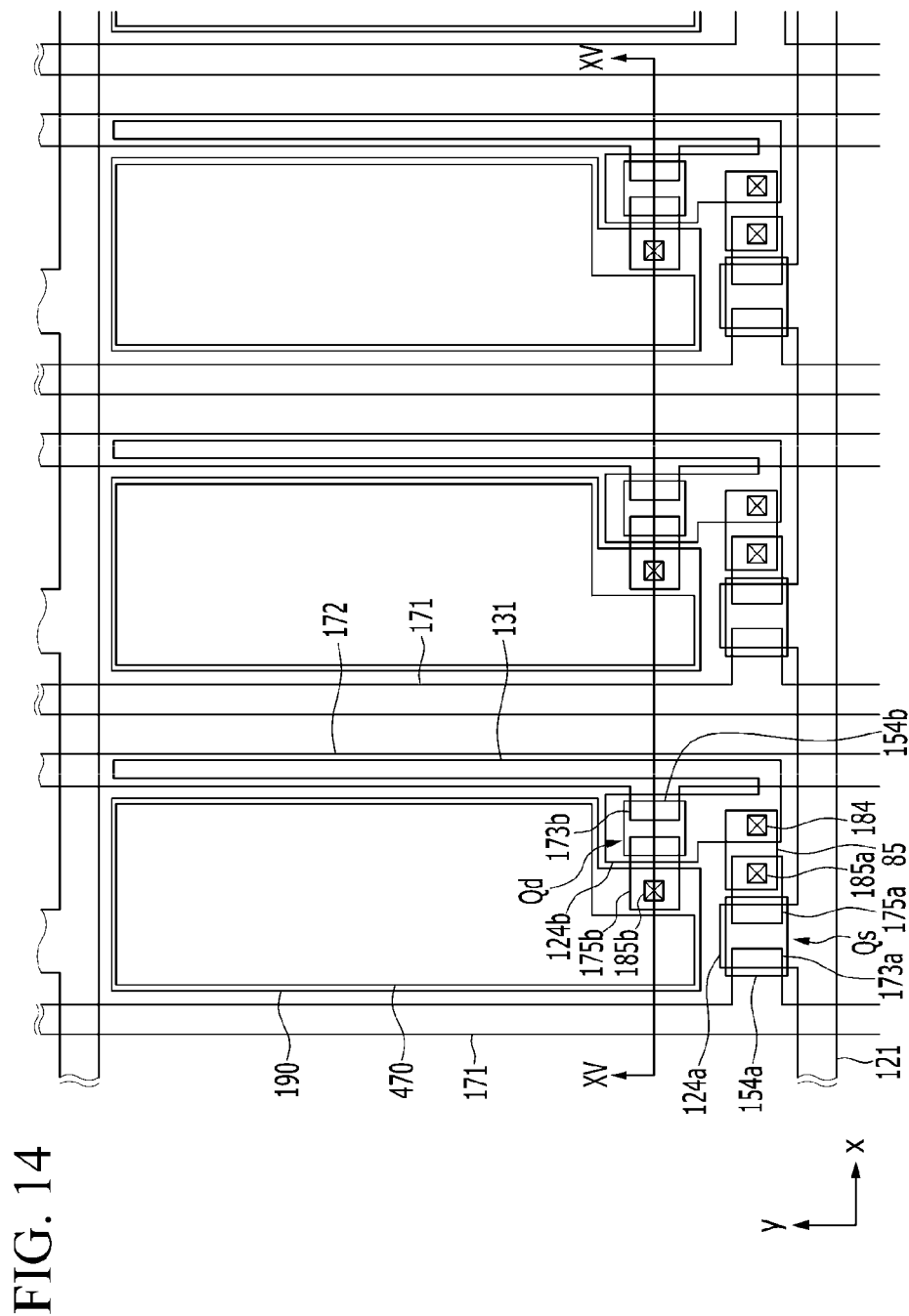
FIG. 14 is a top plan view of a plurality of pixels in an organic light emitting display device according to an exemplary embodiment of the present inventive concept.
Figure 15:
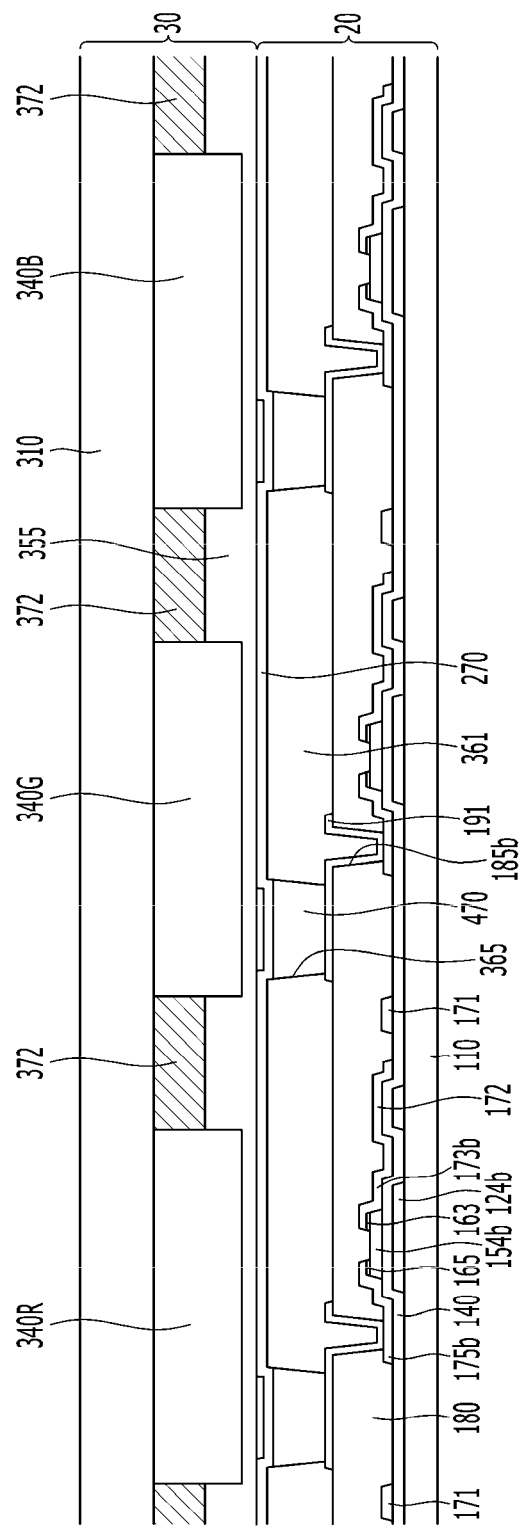
FIG. 15 is a cross-sectional view of FIG. 14, taken along the line XV-XV.

FIG. 14 is a top plan view of a plurality of pixels in an organic light emitting display according to an exemplary embodiment of the present invention, and FIG. 15 is a cross-sectional view of FIG. 14, taken along the line XV-XV.

The organic light emitting display device according to the present exemplary embodiment may include a color conversion panel 30 and an organic light emitting panel 20.

The color conversion panel 30 shown in FIG. 14 to FIG. 15 is the same as the color conversion panel 30 according to the exemplary embodiment of FIG. 6, and any redundant description will be omitted.

Referring to FIG. 14 and FIG. 15, a plurality of gate conductors including a plurality of first gate lines 121 and a plurality of second gate electrodes 124 are provided on a lower substrate 110, and each of the plurality of gate lines 121 includes a first gate electrode 124a.

The gate lines 121 transmit a gate signal and extend in the X-axis direction.

The first gate electrode 124a protrudes along the Y-axis direction from the gate line 121, and the second gate electrode 124b is separated from the gate line 121 and includes a storage electrode line 131.

A gate insulating layer 140 is provided on the gate conductors 121, 124a, and 124b.

A plurality of first and second semiconductor layers 154a and 154b are provided on the gate insulating layer 140. The first and second semiconductor layers 154a and 154b are respectively provided on the first and second gate electrodes 124a and 124b.

A plurality of pairs of ohmic contact members 163 and 165 are respectively provided on the first and second semiconductor layers 154a and 154b.

A plurality of data conductors including a plurality of data lines 171, a plurality of driving voltage lines 172, and a plurality of first and second drain electrodes 175a and 175b are provided on the ohmic contact members 163 and 165 and the gate insulating layer 140.

The data line 171 and the driving voltage line 172 transmit a data signal, and substantially extend in the Y-axis direction, thus crossing the gate lines 121. Each data line 171 includes a plurality of first source electrodes 173a extending toward the first gate electrode 124a.

The driving voltage line 172 transmits a driving voltage and extends in the Y-axis direction, thus crossing the gate line 121. Each driving voltage line 172 includes a plurality of second source electrodes 173b extending toward the second gate electrode 124b. The driving voltage line 172 overlaps the storage electrode line 131, and may be connected with each other.

The first and second drain electrodes 175a and 175b are separated from each other, and also separated from the data line 171 and the driving voltage line 172. The first source electrode 173a and the first drain electrode 175a cover opposite sides of the first gate electrode 124a, and the second source electrode 173a and the second drain electrode 175b cover opposite sides of the second gate electrode 124b.

The semiconductor layers 154a and 154b include portions that are exposed between the source electrodes 173a and 173b and the drain electrodes 175a and 175b.

A passivation layer 180 is provided above the data conductors 171, 172, 173a, 173b, 175a, and 175b and the exposed semiconductor layers 154a and 154b.

A plurality of contact holes 185a and 185b respectively exposing the first and second drain electrodes 175a and 175b are provided in the passivation layer 180, and a contact hole 184 exposing the second gate electrode 124b is provided in the passivation layer 180 and the gate insulating layer 140.

A plurality of pixel electrodes 191 and a plurality of connection members 85 are provided on the passivation layer 180.

Each pixel electrode 191 is physically and electrically connected with the second drain electrode 175b through the contact hole 185b, and the connection member 85 is connected with the second gate electrode 124b and the first drain electrode 175a through the contact holes 184 and 185a.

A partitioning wall 361 is provided on the passivation layer 180. The partitioning wall 361 defines an opening 365 by surrounding the peripherial area of the pixel electrode 191, and is made of an organic or inorganic insulating material. The paritioning wall 361 may be formed of a photoresist including a black pigment, and in this case, the partitioning wall 316 may function as a light blocking member.

An organic light emitting member 470 is provided in an opening 365 between every neighboring paritioning walls 361. In the present exemplary embodiment, the organic light emitting member 470 of the organic light emitting display device may include an emission layer that emits blue light.

A general organic light emitting display device includes organic materials each emitting light of a primary color such as red, green, and blue, but the organic light emitting display device according to the present exemplary embodiment includes the color conversion panel 30 including a red color conversion layer, a green color conversion layer, and a transmission layer as in the exemplary embodiment of FIG. 6 and the emission layer emitting blue light. This way, and red, green, and blue can be represented.

Further, unlikely, when the color conversion panel 30 includes a blue conversion layer instead of the transmission layer, an emission layer emitting light of white may be included.

The organic light emitting member 470 may have a multi-layered structure including an auxiliary layer (not shown) for improving luminous efficiency of the emission layer in addition to the emission layer (not shown) that emits light. In the auxiliary layer, an electron transport layer (not shown) and a hole transport layer (not shown) for balancing electrons and holes and an electron injecting layer (not shown) and a hole injecting layer (not shown) for reinforcing injection of electrons and holes.

A common electrode 270 is disposed on the organic light emitting member 470.

In such an organic light emitting display device, a first gate electrode 124a connected to the gate line 121 and a first source electrode and a first drain electrode 175a connected to the data line 171 form a switching thin film transistor Qs together with the first semiconductor layer 154a, and a channel of the switching thin film transistor Qs is provided in the first semiconductor layer 154a between the first source electrode 173a and the first drain electrode 175a. A second gate electrode 124b connected to the first drain electrode 175a, a second source electrode 173b connected to the driving voltage line 172, and a second drain electrode 175b connected to the pixel electrode 191 form a driving thin film transistor Qd together with a semiconductor layer 154b, and a channel of the driving thin transistor Qd is provided in the second semiconductor layer 154b between the second source electrode 173b and the second drain electrode 175b. The pixel electrode 191, the organic light emitting member 470, and the common electrode 270 form an organic light emitting diode, and the pixel electrode 191 may be an anode and the common electrode 270 may be a cathode, or the pixel electrode 191 may be a cathode and the common electrode 270 may be an anode. The storage electrode line 131 and the driving voltage line 172 that overlap each other form a storage capacitor Cst.

A planarization layer 355 of the color conversion panel 30 is disposed facing the common electrode 270 of an organic light emitting panel 20.

Such an organic light emitting display device can display an image by emitting light to an upper side of the lower substrate 110 that faces toward the color conversion panel 30.

However, unlike the above-stated exemplary embodiment, when the color conversion panel 30 is disposed below the lower substrate 110 of the organic light emitting panel 20, the organic light emitting display device may be a bottom emission type display that displays an image by emitting light downward from the lower substrate 110.

The organic light emitting display dvice according to the present exemplary embodiment can improve a light quantity and color reproducibility through a color conversion panel that is disposed on the display panel and includes a color conversion layer that includes an inorganic phosphor or a quantum dot that can have a lambertian scattering state.

As described above, according to the exemplary embodiment of the present inventive concept, it is possible to prevent a quenching phenomenon caused by damage of the nanophosphor that occurs during a process by adding the antioxidant to the photosensitive resin composition includ-

| <Description of symbols> | |
|---|---|
| 124: gate electrode | 140: gate insulating layer |
| 173: source electrode | 175: drain electrode |
| 180a: first passivation layer | 180b: second passivation layer |
| 230: color filter | 10: display panel |
| 12, 22: polarizing plate | 30: color conversion panel |
| 310: first substrate | 131: sustain electrode |
| 11: first alignment layer | 21: second alignment layer |
| 110: lower substrate | 121: gate line |
| 191: pixel electrode | 220: light blocking layer |
| 390: capping layer | 270: common electrode |
| 305: microcavity | 307FP: liquid crystal inlet |
| 307: inlet | 31: liquid crystal molecule |
| 10: display panel | 30: color conversion panel |
| 372: light blocking member | 340B: transmission layer |
| 210: upper substrate | 470: organic light emitting member |
| 340R, 340G: color conversion layer | |

What is claimed is:

1. A photosensitive resin composition comprising:
a nanophosphor, a photopolymerization initiator, a photopolymerization compound, an antioxidant, and a solvent,
wherein the antioxidant includes a phenol-based compound, a phosphorus-based compound, and a sulfur-based compound, and
wherein the phenol-based antioxidant includes at least one of 2,6-diphenyl-4-octadesiloxyphenol, distearyl(3,5-di-tert-butyl-4-hydroxybenzyl) phosphonate, tridecyl 3,5-di-tert-butyl-4-hydroxybenzyl thioacetate, 4,4'-thiobis (6-tert-butyl-m-cresol), 2-octylthio-4,6-di(3,5-di-tert-butyl-4-hydroxyphenoxy)-s-triazine, 2,2'-ethylidenebis (4,6-di-tert-butylphenol), bis[2-tert-butyl-4-methyl-6-(2-hydroxy-3-tert-butyl-5-methylbenzyl) phenyl] terephthalate, 1,3,5-tris(2,6-dimethyl-3-hydroxy-4-tert-butylbenzyl) isocyanurate, 3,9-bis[2-(3-tert-butyl-4-hydroxy-5-methylhydrocinnamoyloxy)-1,1-dimethylethyl]-2,4,8,10-tetraoxaspiro[5.5]undecane, and triethyleneglycolbis[β-(3-tert-butyl-4-hydroxy-5-methylphenyl) propionate].

2. The photosensitive resin composition of claim 1, wherein the nanophosphor comprises at least one of a quantum dot and an inorganic phosphor.

3. The photosensitive resin composition of claim 2, wherein:
the phosphorus-based antioxidant includes at least one of triphenyl phosphite, tris(2,4-di-tert-butylphenyl) phosphite, tris(2,5-di-tert-butylphenyl) phosphite, tris(nonylphenyl) phosphite, tris(dinonylphenyl) phosphite, tris (mono,di-mixed nonylphenyl) phosphite, diphenylacid phosphite, 2,2'-methylenebis(4,6-di-tert-butylphenyl) octyl phosphite, diphenyldecyl phosphite, diphenyloctyl phosphite, di(nonylphenyl)pentaerythritol diphosphite, phenyldiisodecyl phosphite, tributyl phosphite, tris(2-ethylhexyl) phosphite, tridecyl phosphite, trilauryl phosphite, dibutyl acid phosphite, dilauryl acid phosphite, trilauryl trithiophosphite, bis(neopentylglycol) 1,4-cyclohexanedimethyl diphosphite, bis(2,4-di-tert-butylphenyl)pentaerythritol diphosphite, bis(2,5-di-tert-butylphenyl)pentaerythritol diphosphite, bis(2,6-di-tert-butyl-4-methylphenyl)pentaerythritol diphosphite, bis(2,4-dicumylphenyl)pentaerythritol diphosphite, distearylpentaerythritol diphosphite, tetra (C12-15 mixed-alkyl)-4,4'-isopropylidenediphenyl phosphite, bis[2,2'-methylenebis(4,6-diamylphenyl) ]isopropylidenediphenyl phosphite, tetratridecyl 4,4'-butylidenebis(2-tert-butyl-5-methylphenol) diphosphite, hexa(tridecyl) 1,1,3-tris(2-methyl-5-tert-butyl-4-hydroxyphenyl)butane triphosphite, tetrakis(2,4-di-tert-butylphenyl)biphenylene diphosphonite, tris(2-[(2,4,7,9-tetrakis-tert-butyldibenzo[d,f][1,3,2]dioxaphosphepin-6-yl) oxy]ethyl)amine, 9,10-dihydro-9-oxa-10-phosphaphenanthrene-10-oxide, tris(2-[(2,4,8,10-tetrakis-tert-butyldibenzo[d,f][1,3,2,]dioxaphosphepin-6-yl)oxy ]ethyl) amine, and 2(1,1-dimethylethyl)-6-methyl-4-[3-[[2,4,8,10-tetrakis(1,1-dimethylethyl)dibenzo[d,f][1,3,2]dioxaphosphepin-6-yl]oxy]propyl]phenol 2-butyl-2-ethylpropanediol 2,4,6-tri-tert-butylphenol monophosphite.

4. The photosensitive resin composition of claim 2, wherein the sulfur-based antioxidant includes at least one of dialkylthiodipropionates and β-alkylmercaptopropionic acid esters of polyol.

5. The photosensitive resin composition of claim 2, wherein:
the antioxidant is included in a content of 1 to 5 wt % based on a total weight of a solid of the photosensitive resin composition.

6. The photosensitive resin composition of claim 2, wherein:
the quantum dot comprises one or more of a Group II-VI compound, a Group III-V compound, a Group III-VI compound, a Group IV-VI compound, a Group II-III-V compound, a Group II-III-VI compound, a Group IV element, and a Group IV compound, and
the quantum dot has a core-shell structure including a core and a shell covering the core.

7. The photosensitive resin composition of claim 6, wherein:
the core includes at least one of CdSe, CdS, ZnS, ZnSe, CdTe, CdSeTe, CdZnS, PbSe, AgInZnS, ZnTe, CdSeS, PbS, PbTe, HgS, HgSe, HgTe, GaN, GaP, GaAs, InP, InZnP, InGaP, InGaN, InAs, and ZnO, and
the shell includes at least one of CdSe, ZnSe, ZnS, ZnTe, CdTe, PbS, SrSe, CdO, CdS, ZnO, InP, InS, GaP, GaN, GaO, InZnP, InGaP, InGaN, InZnSCdSe, and HgSe.

8. The photosensitive resin composition of claim 2, wherein:
the inorganic phosphor includes one or more of garnets, silicates, sulfides, oxides (oxynitrides), nitrides, and aluminates.

9. The photosensitive resin composition of claim 8, wherein:
the inorganic phosphor includes at least one of Y3Al5O12:Ce3+(YAG:Ce), Tb3Al5O12:Ce3+(TAG:Ce), (Sr,Ba,Ca)2SiO4:Eu2+, (Sr,Ba,Ca,Mg,Zn)2Si(OD)4:Eu2+D=F,Cl,S,N,Br, Ba2MgSi2O7:Eu2+, Ba2SiO4:Eu2+, Ca3(Sc,Mg)2Si3O12:Ce3+, (Ca,Sr)S:Eu2+, (Sr,Ca)Ga2S4:Eu2+, SrSi2O2N2:Eu2+, SiAlON:Ce3+, β-SiAlON:Eu2+, Ca-α-SiAlON:Eu2+, Ba3Si6O12N2:Eu2+, CaAlSiN3:Eu2+, (Sr,Ca)AlSiN3:Eu2+, Sr2Si5N8:Eu2+, (Sr,Ba)Al2O4:Eu2+, (Mg,Sr)Al2O4:Eu2+, and BaMg2Al16O27:Eu2+.

10. The photosensitive resin composition of claim 2, further comprising:
a dispersant.

11. The photosensitive resin composition of claim 10, further comprising:
a light scatterer.

12. The photosensitive resin composition of claim 11, wherein:
the light scatterer includes at least one of TiO2, Al2O3, and SiO2.

13. A display device including a photosensitive resin composition, comprising:
a lower substrate,
a thin film transistor provided on the lower substrate;
a pixel electrode connected with the thin film transistor;
an upper substrate facing the lower substrate; and
a color filter provided between the lower substrate and the upper substrate,
wherein the color filter comprises a nanophosphor and an antioxidant, and the antioxidant comprises a phenol-based compound, a phosphorus-based compound and a sulfur-based compound, and
wherein the phenol-based antioxidant includes at least one of 2,6-diphenyl-4-octadesiloxyphenol, distearyl(3,5-di-tert-butyl-4-hydroxybenzyl) phosphonate, tridecyl 3,5-di-tert-butyl-4-hydroxybenzyl thioacetate, 4,4'-thiobis (6-tert-butyl-m-cresol), 2-octylthio-4,6-di(3,5-di-tert-butyl-4-hydroxyphenoxy)-s-triazine,2,2'-ethylidenebis (4,6-di-tert-butylphenol), bis[2-tert-butyl-4-methyl-6-(2-hydroxy-3-tert-butyl-5-methylbenzyl)phenyl] terephthalate, 1,3,5-tris(2,6-dimethyl-3-hydroxy-4-tert-butylbenzyl) isocyanurate, 3,9-bis [2-(3-tert-butyl-4-hydroxy-5-methylhydrocinnamoyloxy)-1,1-dimethylethyl]-2,4,8,10-tetraoxaspiro [5.5]undecane, and triethyleneglycolbis[β-(3-tert-butyl-4-hydroxy-5-methylphenyl) propionate].

14. The display device of claim 12, wherein the nanophosphor comprises at least one of a quantum dot and an inorganic phosphor.

15. The display device of claim 14, wherein the antioxidant is included in a content of 1 to 5 wt % based on a total weight of a solid of the photosensitive resin composition.

16. The display device of claim 14, wherein:
the quantum dot comprises one or more of a Group II-VI compound, a Group III-V compound, a Group III-VI compound, a Group IV-VI compound, a Group II-III V compound, a Group II-III-VI compound, a Group IV element, and a Group IV compound, and
the quantum dot has a core-shell structure including a core and a shell covering the core.

17. The display device of claim 14, wherein:
the inorganic phosphor includes one or more of garnets, silicates, sulfides, oxides (oxynitrides), nitrides, and aluminates.

18. The display device of claim 14, wherein the photosensitive resin composition further comprises a dispersant.

19. The display device of claim 18, wherein the photosensitive resin composition further comprises a light scatterer.

20. A color conversion panel comprising:
a first substrate,
a plurality of color conversion layers and a transmission layer provided on the first substrate; and
a light blocking member provided between neighboring color conversion layers and between one of the plurality of color conversion layers and the transmission layer,
wherein the color conversion layer comprises a nanophosphor and an antioxidant, and
the antioxidant comprises a phenol-based compound, a phosphorus-based compound, and a sulfur-based compound, and
wherein the phenol-based antioxidant includes at least one of 2,6-diphenyl-4-octadesiloxyphenol, distearyl(3,5-di-tert-butyl-4-hydroxybenzyl) phosphonate, tridecyl 3,5-di-tert-butyl-4-hydroxybenzyl thioacetate, 4,4'-thiobis (6-tert-butyl-m-cresol), 2-octylthio-4,6-di(3,5-di-tert-butyl-4-hydroxyphenoxy)-s-triazine, 2,2'-ethylidenebis (4,6-di-tert-butylphenol), bis[2-tert-butyl-4-methyl-6-(2-hydroxy-3-tert-butyl-5-methylbenzyl) phenyl] terephthalate, 1,3,5-tris(2,6-dimethyl-3-hydroxy-4-tert-butylbenzyl) isocyanurate, 3,9-bis [2-(3-tert-butyl-4-hydroxy-5-methylhydrocinnamoyloxy)-1,1-dimethylethyl]-2,4,8,10-tetraoxaspiro [5.5]undecane, and triethyleneglycolbis[β-(3-tert-butyl-4-hydroxy-5-methylphenyl) propionate].

21. The color conversion panel of claim 20, wherein the nanophosphor comprises at least one of a quantum dot and an inorganic phosphor.

22. The color conversion panel of claim 21, wherein the antioxidant is included in a content of 1 to 5 wt % based on a total weight of a solid of the color conversion layer.

23. The color conversion panel of claim 21, wherein the color conversion layer further comprises at least one of a dispersant and a light scatterer.

24. A display panel comprising:
a display panel; and
a color conversion panel provided on the display panel,
wherein the color conversion panel comprises:
a first substrate;
a plurality of color conversion layers and a transmission layer provided on one side of the first substrate, facing the display panel; and
a light blocking member provided between every neighboring color conversion layers among the plurality of color conversion layers and between one of the plurality of color conversion layers and the transmission layer,
wherein the color conversion layer comprises a nanophosphor and an antioxidant, and
the antioxidant comprises a phenol-based compound, a phosphorus-based compound, and a sulfur-based compound, and
wherein the phenol-based antioxidant includes at least one of 2,6-diphenyl-4-octadesiloxyphenol, distearyl(3,5-di-tert-butyl-4-hydroxybenzyl) phosphonate, tridecyl 3,5-di-tert-butyl-4-hydroxybenzyl thioacetate, 4,4'-thiobis (6-tert-butyl-m-cresol), 2-octylthio-4,6-di(3,5-di-tert-butyl-4-hydroxyphenoxy)-s-triazine, 2,2'-ethylidenebis (4,6-di-tert-butylphenol), bis[2-tert-butyl-4-methyl-6-(2-hydroxy-3-tert-butyl-5-methylbenzyl) phenyl] terephthalate, 1,3,5-tris(2,6-dimethyl-3-hydroxy-4-tert-butylbenzyl) isocyanurate, 3,9-bis [2-(3-tert-butyl-4-hydroxy-5-methylhydrocinnamoyloxy)-1,1-dimethylethyl]-2,4,8,10-tetraoxaspiro [5.5]undecane, and triethyleneglycolbis[β-(3-tert-butyl-4-hydroxy-5-methylphenyl) propionate].

25. The display device of claim 24, wherein:
the display panel comprises:
a lower substrate;
a thin film transistor provided on the lower substrate; and
a pixel electrode connected with the thin film transistor.

26. The display device of claim 25, further comprising:
an upper substrate facing the lower substrate and spaced apart by a distance; and
a liquid crystal layer provided between the lower substrate and the upper substrate.

27. The display device of claim 25, further comprising:
an organic light emitting member provided on the pixel electrode; and
a common electrode provided on the organic light emitting member.

28. The display device of claim 24, wherein the antioxidant reacts with free radicals generated from the photosensitive resin under a high temperature condition.

* * * * *